(12) United States Patent
Kim et al.

(10) Patent No.: US 11,711,920 B2
(45) Date of Patent: Jul. 25, 2023

(54) THREE-DIMENSIONAL SEMICONDUCTOR MEMORY DEVICES

(71) Applicant: Samsung Electronics Co., Ltd., Suwon-si (KR)

(72) Inventors: Sunggil Kim, Yongin-si (KR); Seulye Kim, Seoul (KR); Jung-Hwan Kim, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 328 days.

(21) Appl. No.: 17/076,306

(22) Filed: Oct. 21, 2020

(65) Prior Publication Data
US 2021/0305276 A1    Sep. 30, 2021

(30) Foreign Application Priority Data
Mar. 26, 2020 (KR) .................. KR10-2020-0037050

(51) Int. Cl.
*H01L 27/11582* (2017.01)
*H10B 43/27* (2023.01)
*H10B 41/27* (2023.01)
*H01L 21/02* (2006.01)

(52) U.S. Cl.
CPC ............ *H10B 43/27* (2023.02); *H10B 41/27* (2023.02); *H01L 21/02233* (2013.01)

(58) Field of Classification Search
CPC ...................... H01L 27/11578; H01L 27/11582
See application file for complete search history.

(56) References Cited

U.S. PATENT DOCUMENTS

| 7,416,956 B2 | 8/2008 | Yuan |
| 8,658,499 B2 | 2/2014 | Makala et al. |
| 9,444,046 B2 | 9/2016 | Pio |
| 9,543,318 B1 | 1/2017 | Lu et al. |
| 9,881,929 B1 | 1/2018 | Ravikirthi et al. |
| 9,917,100 B2 | 3/2018 | Zhang et al. |
| 10,373,969 B2 | 8/2019 | Zhang et al. |
| 10,381,434 B1* | 8/2019 | Pachamuthu ....... H01L 29/0607 |
| 10,388,664 B2 | 8/2019 | Huang et al. |
| 10,438,963 B2 | 10/2019 | Kim |
| 2021/0265380 A1* | 8/2021 | Obu .................. H01L 27/11548 |

* cited by examiner

*Primary Examiner* — Christopher A Johnson
(74) *Attorney, Agent, or Firm* — Fish & Richardson P.C.

(57) ABSTRACT

A semiconductor memory device includes a substrate with a cell array region and a connection region, an electrode structure including electrodes stacked on the substrate and having a staircase structure on the connection region, a vertical channel structure on the cell array region to penetrate the electrode structure and electrically connected to the substrate, a dummy structure on the connection region to penetrate the staircase structure, and a first sidewall oxide pattern interposed between the substrate and the dummy structure. The dummy structure includes an upper portion that is on the substrate, a middle portion that is in contact with the first sidewall oxide pattern, and a lower portion that is below the middle portion. With increasing vertical distance from the upper portion, a diameter of the middle portion decreases until it reaches its smallest value and then increases.

19 Claims, 22 Drawing Sheets

THREE-DIMENSIONAL SEMICONDUCTOR MEMORY DEVICES

CROSS-REFERENCE TO RELATED APPLICATION(S)

This U.S. non-provisional patent application claims priority under 35 U.S.C. § 119 to Korean Patent Application No. 10-2020-0037050, filed on Mar. 26, 2020, in the Korean Intellectual Property Office, the entire contents of which are hereby incorporated by reference.

BACKGROUND

The present disclosure relates to semiconductor devices. Higher integration of semiconductor devices may be used to satisfy consumer demands for superior performance and inexpensive prices. In the case of semiconductor devices, since their integration is an important factor in determining product prices, increased integration may be especially beneficial. In the case of two-dimensional or planar semiconductor devices, since their integration is mainly determined by the area occupied by a unit memory cell, integration is greatly influenced by the level of a fine pattern forming technology. However, the extremely expensive process equipment that is typically used to increase pattern fineness may set a practical limitation on increasing integration for two-dimensional or planar semiconductor devices. To overcome such a limitation, three-dimensional semiconductor memory devices including three-dimensionally arranged memory cells have recently been proposed.

SUMMARY

An embodiment of the inventive concept provides a three-dimensional semiconductor memory device with improved reliability.

According to an embodiment of the inventive concept, a semiconductor memory device may include a substrate with a cell array region and a connection region, an electrode structure including electrodes that are stacked on the substrate, the electrode structure having a staircase structure on the connection region, a vertical channel structure on the cell array region to penetrate the electrode structure and electrically connected to the substrate, a dummy structure on the connection region to penetrate the staircase structure, and a first sidewall oxide pattern interposed between the substrate and the dummy structure. The dummy structure may have an upper portion that is on the substrate, a middle portion that is in contact with the first sidewall oxide pattern, and a lower portion that is below the middle portion. A diameter of the middle portion may decrease gradually from the upper portion toward the lower portion, may reach the smallest value between the upper portion and the lower portion, and then may increase with decreasing distance from the lower portion.

According to an embodiment of the inventive concept, a semiconductor device may include a substrate, an electrode structure including electrodes that are stacked on the substrate, and a vertical channel structure penetrating the electrode structure and being electrically connected to the substrate. The vertical channel structure comprises a vertical semiconductor pattern that extends vertically from the substrate. The vertical semiconductor pattern may have a lower semiconductor pattern electrically connected to the substrate, an upper semiconductor pattern on the lower semiconductor pattern, and a middle semiconductor pattern between the lower semiconductor pattern and the upper semiconductor pattern. The middle semiconductor pattern may be located below the lowermost electrode of the electrodes that are stacked on the substrate. The vertical channel structure may further include a gap-fill insulating pattern on an inner surface of the upper semiconductor pattern. The lowermost point of the gap-fill insulating pattern may be located at a level lower than the lowermost electrode. The gap-fill insulating pattern may be spaced apart from the lower semiconductor pattern by the middle semiconductor pattern.

According to an embodiment of the inventive concept, a semiconductor memory device may include a first substrate, a peripheral circuit structure including peripheral transistors on the first substrate, a second substrate on the peripheral circuit structure, the second substrate having a cell array region and a connection region, an electrode structure including electrodes that are stacked on the second substrate, the electrode structure having a staircase structure on the connection region, a vertical channel structure on the cell array region to penetrate the electrode structure and electrically connected to the second substrate, a dummy structure on the connection region to penetrate the staircase structure, an interlayer insulating layer on the electrode structure, a bit line on the interlayer insulating layer and electrically connected to the vertical channel structure, and an upper interconnection line electrically connected to the staircase structure. Each of the vertical channel structure and the dummy structure may include a vertical semiconductor pattern that extends vertically from the second substrate, a vertical insulating pattern interposed between the vertical semiconductor pattern and the electrode structure, the vertical insulating pattern including a tunnel insulating layer, a charge storing layer, and a blocking insulating layer, and a gap-fill insulating pattern on an inner surface of the vertical semiconductor pattern. The dummy structure may have an upper portion that is on the second substrate, a lower portion that extends into the second substrate, and a middle portion interposed between the upper portion and the lower portion. A diameter of the middle portion may decrease gradually from a top surface of the second substrate toward a bottom surface of the second substrate, may reach the smallest value between the top surface and the bottom surface, and then may increase with decreasing distance from the bottom surface.

DETAILED DESCRIPTION

Figure 1:
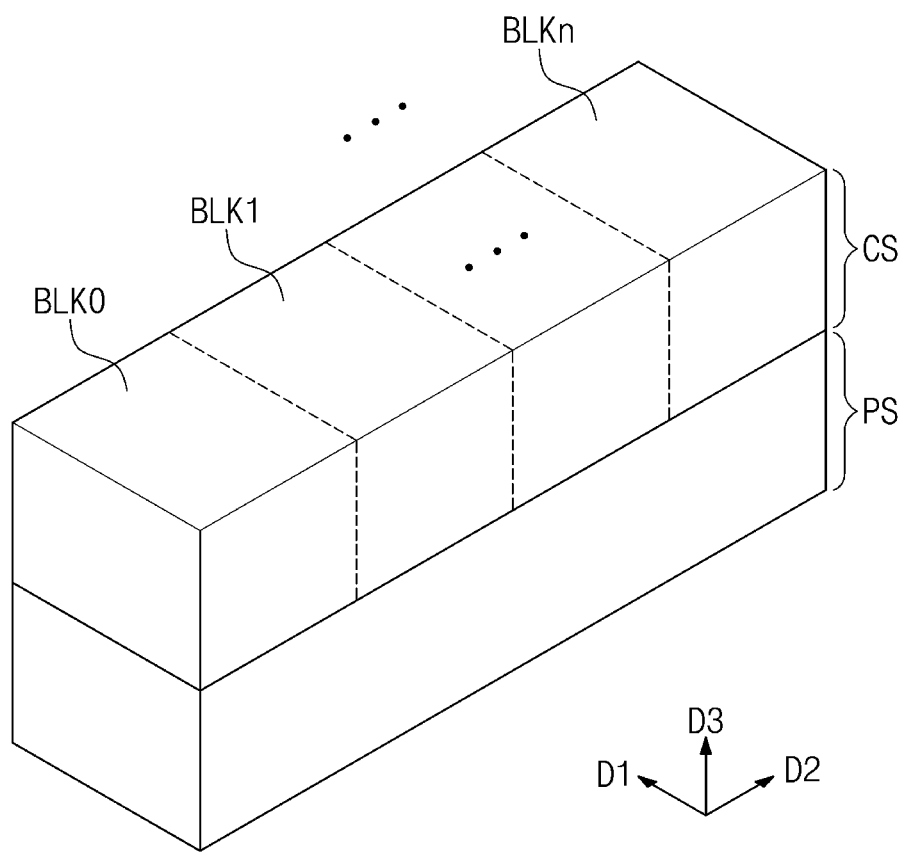
FIG. 1 is a perspective view schematically illustrating a three-dimensional semiconductor memory device according to an embodiment of the inventive concept.

FIG. 1 is a perspective view schematically illustrating a three-dimensional semiconductor memory device according to an embodiment of the inventive concept.

Referring to FIG. 1, a three-dimensional semiconductor memory device according to an embodiment of the inventive concept may include a peripheral circuit structure PS, a cell array structure CS on the peripheral circuit structure PS, and a penetration contact (not shown) vertically connecting the cell array structure CS to the peripheral circuit structure PS. When viewed in a plan view, the cell array structure CS may overlap the peripheral circuit structure PS.

In an embodiment, the peripheral circuit structure PS may include row and column decoders, a page buffer, control circuits, and peripheral logic circuits. The peripheral logic circuits constituting the peripheral circuit structure PS may be integrated on a semiconductor substrate.

The cell array structure CS may include a cell array, in which a plurality of memory cells are three-dimensionally arranged. In detail, the cell array structure CS may include a plurality of memory blocks BLK0 to BLKn. Each of the memory blocks BLK0 to BLKn may include a plurality of memory cells, which are three-dimensionally arranged.

Figure 2:
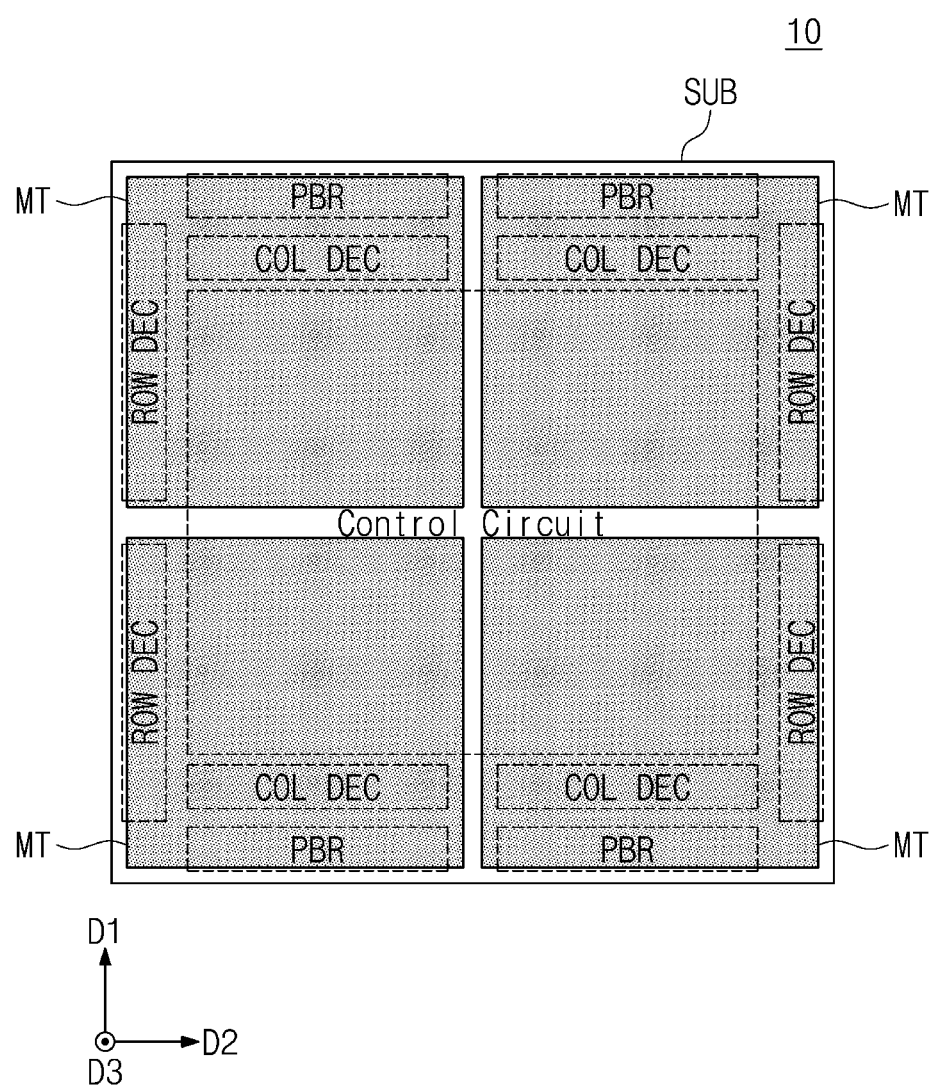
FIG. 2 is a plan view schematically illustrating a three-dimensional semiconductor memory device according to an embodiment of the inventive concept.

FIG. 2 is a plan view schematically illustrating a three-dimensional semiconductor memory device according to an embodiment of the inventive concept.

Referring to FIGS. 1 and 2, the peripheral circuit structure PS and the cell array structure CS described with reference to FIG. 1 may be disposed on a first substrate SUB. In each of a plurality of chip regions 10, row and column decoders ROW DEC and COL DEC, a page buffer PBR, and control circuits, which constitute the peripheral circuit structure PS (e.g., see FIG. 1), may be disposed on the first substrate SUB.

A plurality of mats MT constituting the cell array structure CS (e.g., see FIG. 1) may be disposed on the first substrate SUB. The mats MT may be arranged in a first direction D1 and a second direction D2. Each of the mats MT may include the memory blocks BLK0 to BLKn previously described with reference to FIG. 1.

The mats MT may be disposed to overlap the peripheral circuit structure PS (e.g., see FIG. 1). In an embodiment, the peripheral logic circuits constituting the peripheral circuit structure PS (e.g., see FIG. 1) may be freely disposed below the mats MT.

Figure 3:
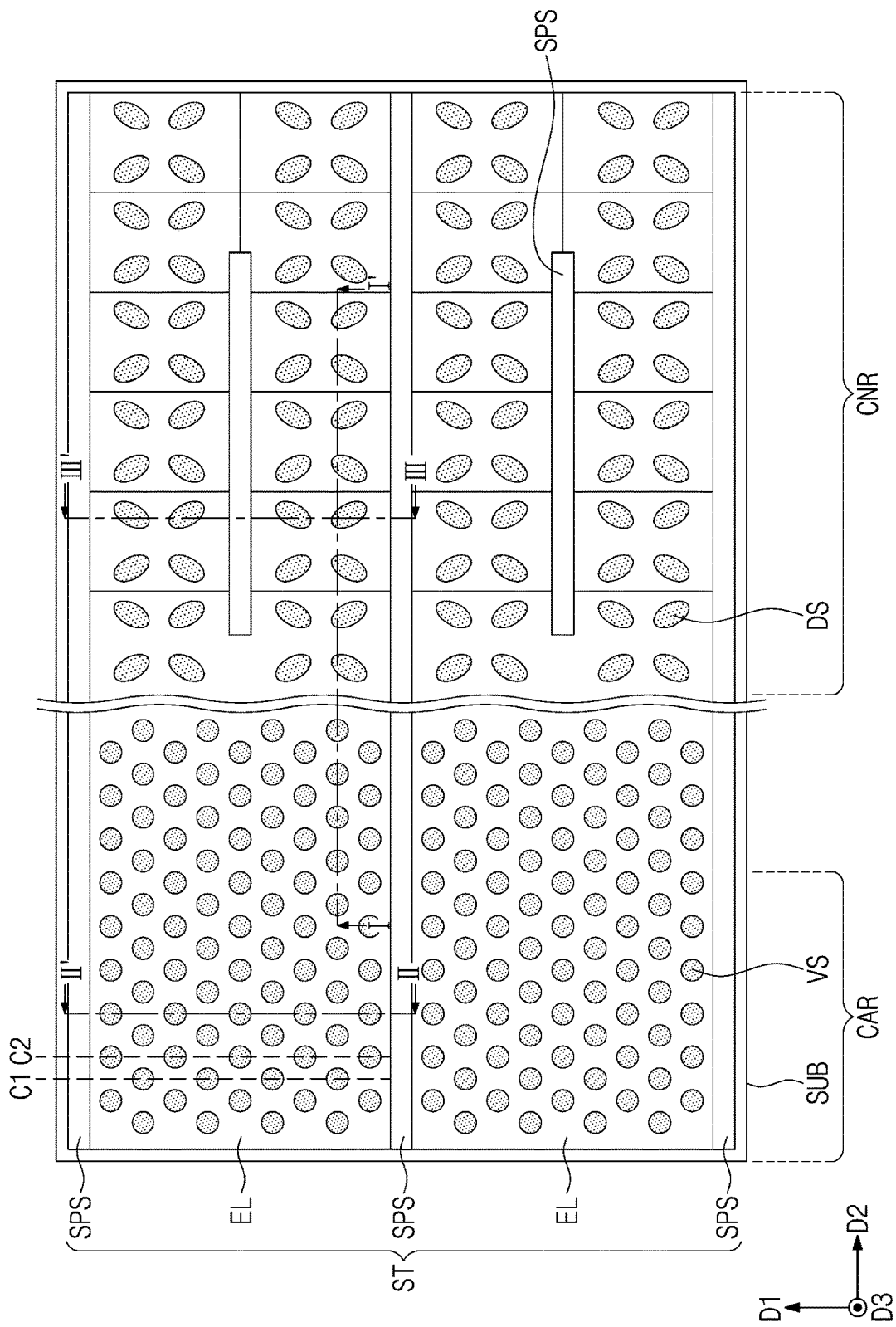
FIG. 3 is a plan view illustrating a three-dimensional semiconductor memory device according to an embodiment of the inventive concept.
Figure 4A:
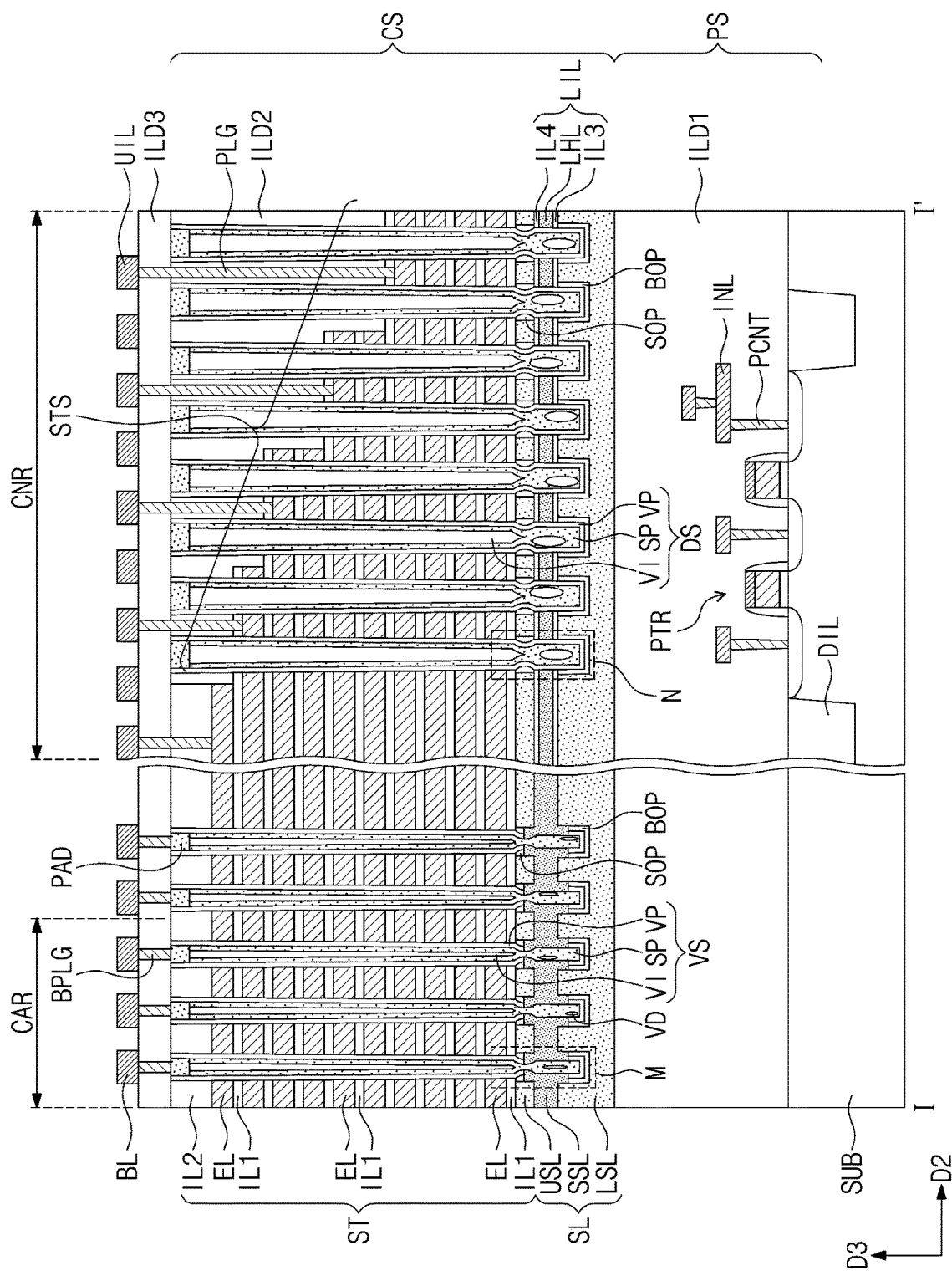
FIGS. 4A, 4B, and 4C are sectional views taken along lines I-I', and of FIG. 3, respectively.
Figure 4B:
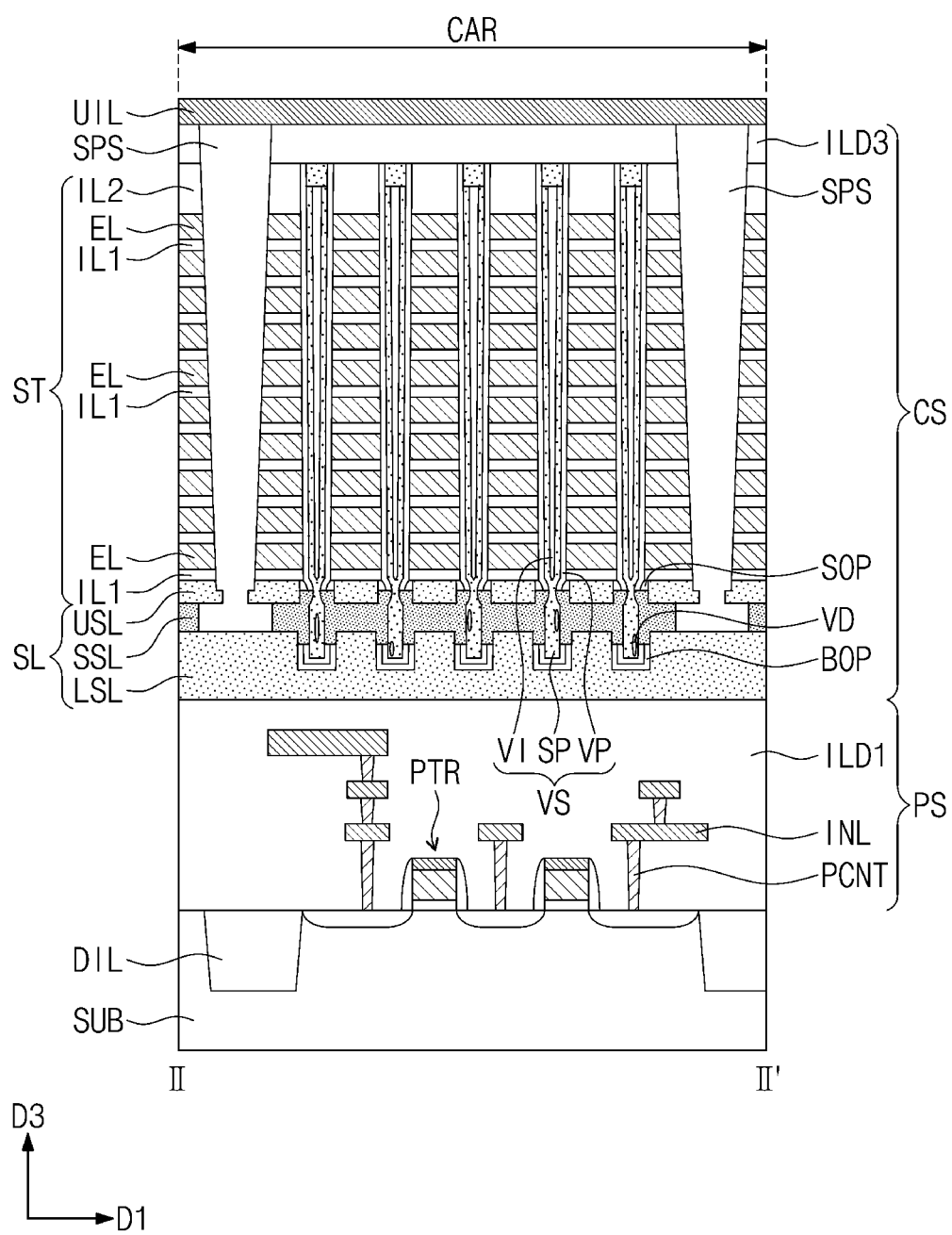
Figure 4C:
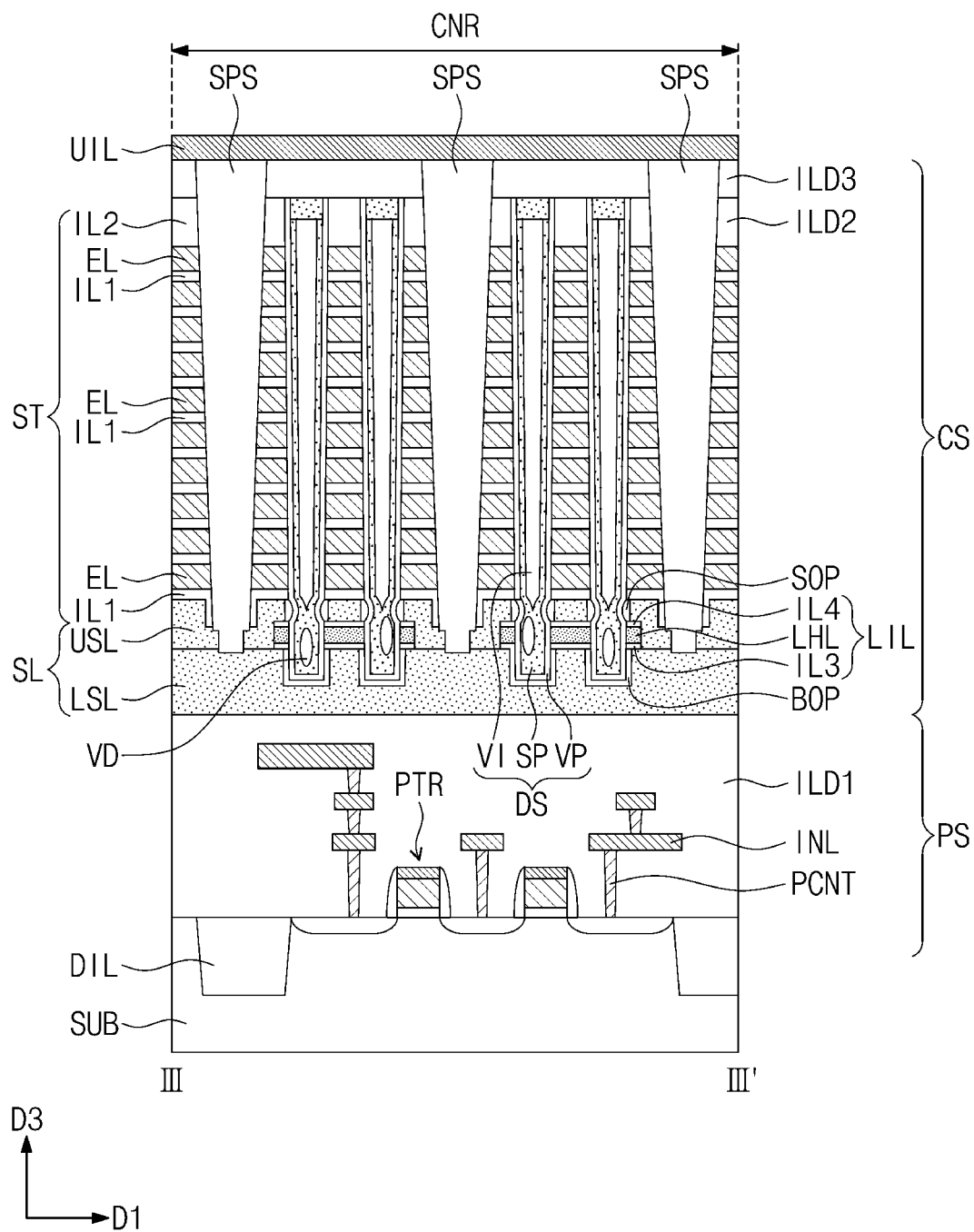
Figure 5A:
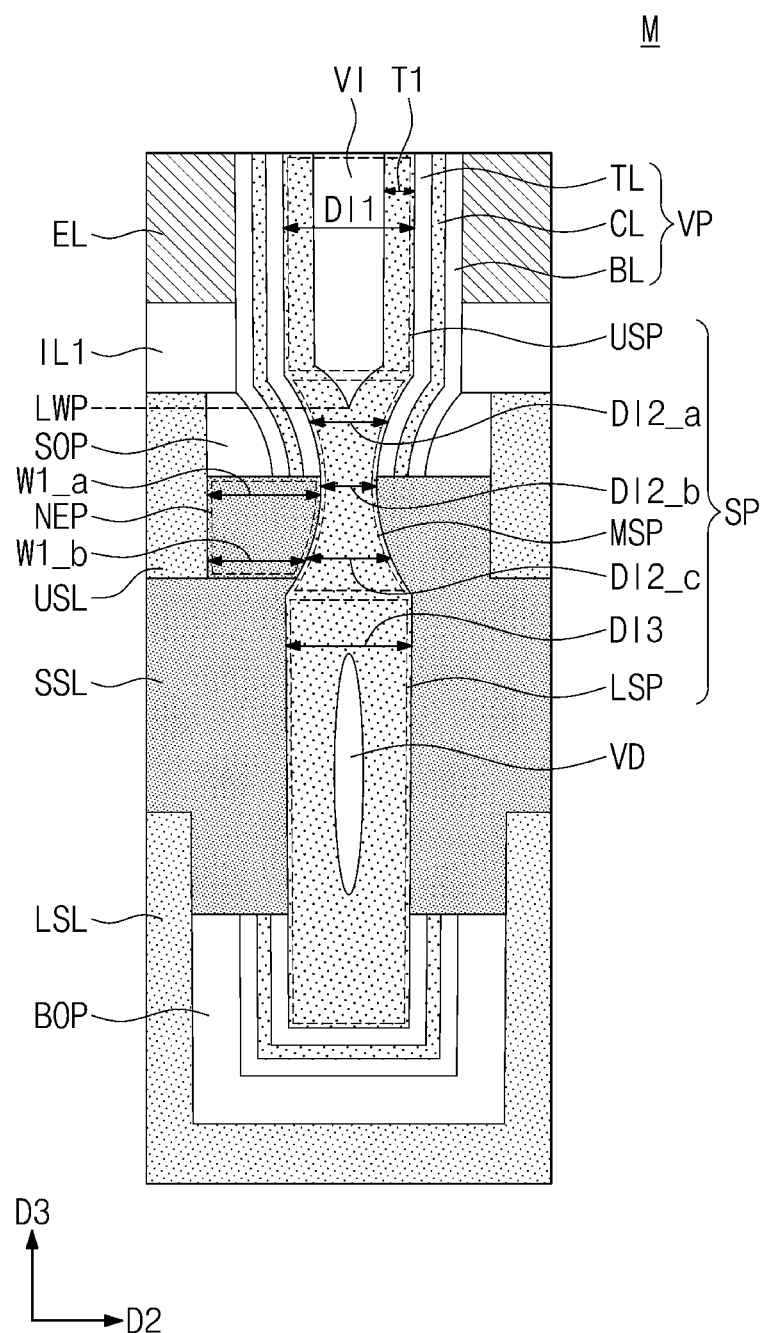
FIG. 5A is an enlarged sectional view of a region 'M' of FIG. 4A.
Figure 5B:
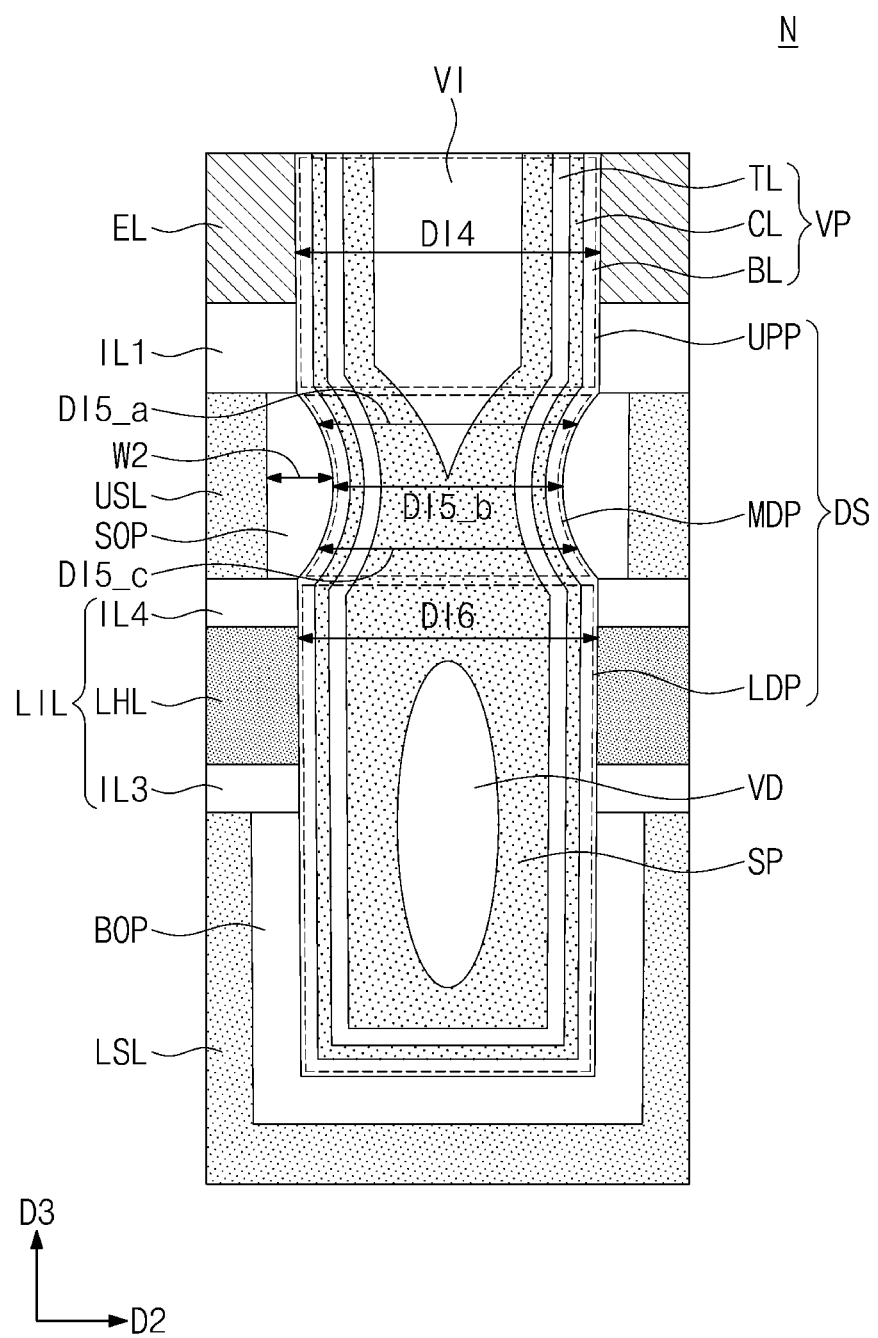
FIG. 5B is an enlarged sectional view of a region 'N' of FIG. 4A.

FIG. 3 is a plan view illustrating a three-dimensional semiconductor memory device according to an embodiment of the inventive concept. FIGS. 4A, 4B, and 4C are sectional views taken along lines I-I', and of FIG. 3, respectively. FIG. 5A is an enlarged sectional view of a region 'M' of FIG. 4A. FIG. 5B is an enlarged sectional view of a region 'N' of FIG. 4A. The semiconductor memory device of FIG. 3 may be a portion of a memory cell structure provided in one of the mats MT of FIG. 2.

Referring to FIGS. 3 and 4A to 4C, the peripheral circuit structure PS including peripheral transistors PTR may be disposed on the first substrate SUB. The cell array structure CS including an electrode structure ST may be disposed on the peripheral circuit structure PS. The first substrate SUB may be a silicon substrate, a silicon-germanium substrate, a germanium substrate, or a single crystalline epitaxial layer grown on a single crystalline silicon substrate. The first substrate SUB may include active regions, which are defined by a device isolation layer DIL.

The peripheral circuit structure PS may include the peripheral transistors PTR, which are formed on the active regions of the first substrate SUB. The peripheral transistors PTR may constitute the row and column decoders, the page buffer, the control circuit, the peripheral logic circuit, or the like, as described above.

The peripheral circuit structure PS may further include lower interconnection lines INL, which are provided on the peripheral transistors PTR, and a first interlayer insulating layer ILD1, which is provided on (e.g., to cover) the peripheral transistors PTR and the lower interconnection lines INL. A peripheral contact PCNT may be provided between the lower interconnection line INL and the peripheral transistor PTR to electrically connect the lower interconnection line INL to the peripheral transistor PTR. The first interlayer insulating layer ILD1 may include a plurality of stacked insulating layers. For example, the first interlayer insulating layer ILD1 may be formed of or include at least one of silicon oxide, silicon nitride, silicon oxynitride, and/or low-k dielectric materials.

The cell array structure CS may be provided on the first interlayer insulating layer ILD1 of the peripheral circuit structure PS. Hereinafter, the cell array structure CS will be described in more detail below. A second substrate SL may be provided on the first interlayer insulating layer ILD1. As an example, the second substrate SL may be a rectangular plate constituting a lower portion of the mat MT of FIG. 2. The second substrate SL may support the electrode structure ST thereon.

The second substrate SL may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or include at least one of various semiconductor materials (e.g., silicon (Si), germanium (Ge), silicon germanium (SiGe), gallium arsenide (GaAs), indium gallium arsenide (InGaAs), aluminum gallium arsenide (AlGaAs), or compounds thereof). Each of the lower semiconductor layer LSL, the source semiconductor layer SSL, and the upper semiconductor layer USL may have a single crystalline structure, an amorphous structure, and/or a polycrystalline structure. As an example, each of the lower semiconductor layer LSL, the source semiconductor layer SSL, and the upper semiconductor layer USL may be an n-type doped poly-silicon layer. The lower semiconductor layer LSL, the source semiconductor layer SSL, and the upper semiconductor layer USL may have at least two different doping concentrations. For example, the doping concentration of the source semiconductor layer SSL may be higher than the doping concentration of each of the lower and upper semiconductor layers LSL and USL.

The second substrate SL may include a cell array region CAR and a connection region CNR. The cell array region CAR may be provided to overlap a center of the second substrate SL. The connection region CNR may be provided in a side region of the second substrate SL. The connection region CNR may be extended from a side of the cell array region CAR in the second direction D2.

Referring to FIG. 4A, on the cell array region CAR, the source semiconductor layer SSL may be interposed between the lower semiconductor layer LSL and the upper semiconductor layer USL. The lower semiconductor layer LSL and the upper semiconductor layer USL may be electrically connected to each other by the source semiconductor layer SSL.

On the connection region CNR, a lower insulating layer LIL may be interposed between the lower semiconductor layer LSL and the upper semiconductor layer USL. The lower insulating layer LIL of the connection region CNR may be provided at the same level as the source semiconductor layer SSL of the cell array region CAR. For example, the lower insulating layer LIL may have a bottom surface, which is substantially coplanar with a bottom surface of the source semiconductor layer SSL, and a top surface, which is substantially coplanar with a top surface of the source semiconductor layer SSL.

The lower insulating layer LIL may include a third insulating layer IL3, a lower sacrificial layer LHL, and a fourth insulating layer IL4, which are sequentially stacked. For example, the third and fourth insulating layers IL3 and IL4 may be formed of or include silicon oxide, and the lower sacrificial layer LHL may be formed of or include silicon nitride or silicon oxynitride.

Referring back to FIGS. 3, 4A, 4B, and 4C, the electrode structure ST and a second interlayer insulating layer ILD2 may be provided on the second substrate SL. A top surface of the second interlayer insulating layer ILD2 may be substantially coplanar with a top surface of the electrode structure ST. The second interlayer insulating layer ILD2 may cover a staircase structure STS of the electrode structure ST on the connection region CNR (e.g., see FIG. 4A).

The electrode structure ST may include electrodes EL, which are stacked on the second substrate SL in a direction perpendicular to the second substrate SL (i.e., in a third direction D3). The electrode structure ST may further include first insulating layers IL1 separating the electrodes EL from each other. The first insulating layers IL1 and the electrodes EL in the electrode structure ST may be alternately stacked in the third direction D3. A second insulating layer IL2 may be provided as the topmost portion of the electrode structure ST. The second insulating layer IL2 may be thicker than each of the first insulating layers IL1.

The electrode structure ST may be extended from the cell array region CAR to the connection region CNR. The electrode structure ST may have the staircase structure STS on the connection region CNR. The staircase structure STS of the electrode structure ST may have a height decreasing with increasing distance from the cell array region CAR. In other words, the height of the staircase structure STS of the electrode structure ST may be decreased, as a distance from the cell array region CAR in the second direction D2 increases.

The lowermost one of the electrodes EL of the electrode structure ST may serve as a lower selection line. The uppermost one of the electrodes EL of the electrode structure ST may serve as an upper selection line. The remaining ones of the electrodes EL, except for the lower and upper selection lines, may serve as word lines.

Each of the electrodes EL may be formed of or include a conductive material, which is selected from the group consisting of doped semiconductor materials (e.g., doped silicon), metallic materials (e.g., tungsten, copper, or aluminum), conductive metal nitrides (e.g., titanium nitride or tantalum nitride), and transition metals (e.g., titanium or tantalum). Each of the first and second insulating layers IL1 and IL2 may be formed of or include silicon oxide.

A plurality of vertical channel structures VS penetrating the electrode structure ST may be provided on the cell array region CAR. For example, as shown in FIG. 3, four vertical channel structures VS may be arranged in the first direction D1 to form a first column C1, and five vertical channel structures VS may be arranged in the first direction D1 to form a second column C2. The first and second columns C1 and C2 may be repeatedly and alternately arranged in the second direction D2. A diameter of each of the vertical channel structures VS may be gradually decreased with decreasing distance from the second substrate SL.

Dummy structures DS may be provided on the connection region CNR to penetrate the electrode structure ST. The dummy structures DS may penetrate the staircase structure STS of the electrode structure ST. When viewed in a plan view, a size (e.g., the largest diameter) of each of the dummy structures DS may be larger than a size (e.g., the largest diameter) of each of the vertical channel structures VS.

Each of the vertical channel structures VS may include a vertical insulating pattern VP, a vertical semiconductor pattern SP, and a gap-fill insulating pattern VI. The vertical semiconductor pattern SP may be interposed between the vertical insulating pattern VP and the gap-fill insulating pattern VI. A conductive pad PAD may be provided in or on an upper portion of each of the vertical channel structures VS.

The gap-fill insulating pattern VI may have a circular pillar shape. The vertical semiconductor pattern SP may be provided on (e.g., to cover) an outer surface of the gap-fill insulating pattern VI and may be extended from the lower semiconductor layer LSL to the conductive pad PAD in the third direction D3. The vertical semiconductor pattern SP may be shaped like a pipe with an open top end. The vertical insulating pattern VP may be provided on (e.g., to cover) an outer surface of the vertical semiconductor pattern SP and may be extended from the lower semiconductor layer LSL to a top surface of the second insulating layer IL2 in the third direction D3. The vertical insulating pattern VP may also be shaped like a pipe with an open top end. The vertical insulating pattern VP may be interposed between the electrodes EL of the electrode structure ST and the vertical semiconductor pattern SP.

The vertical insulating pattern VP may include one or more layers. In an embodiment, the vertical insulating pattern VP may include a data storing layer. In an embodiment, the vertical insulating pattern VP may be a data storing layer of a NAND FLASH memory device and may include a tunnel insulating layer TL, a charge storing layer CL, and a blocking insulating layer BL, as will be described with reference to FIG. 5A.

For example, the charge storing layer CL may be a trap insulating layer, a floating gate electrode, or an insulating layer with conductive nano dots. The charge storing layer CL may include at least one of a silicon nitride layer, a silicon oxynitride layer, a silicon-rich nitride layer, a nanocrystalline silicon layer, or a laminated trap layer. The tunnel insulating layer TL may be formed of or include a material whose band gap is larger than that of the charge storing layer. The tunnel insulating layer TL may be formed of or include at least one of various high-k dielectric materials (e.g., aluminum oxide and hafnium oxide) or silicon oxide. The blocking insulating layer BL may be formed of or include silicon oxide.

The vertical semiconductor pattern SP may be formed of or include at least one of various semiconductor materials (e.g., silicon (Si), germanium (Ge), or compounds thereof). In an embodiment, the vertical semiconductor pattern SP may be formed of or include a doped semiconductor material or an intrinsic (i.e., undoped) semiconductor material. Vertical semiconductor patterns SP including the semiconductor material may be used as channel regions of transistors constituting a NAND cell string.

The conductive pad PAD may be provided on (e.g., to cover) a top surface of the vertical semiconductor pattern SP and a top surface of the gap-fill insulating pattern VI. The conductive pad PAD may be formed of or include at least one of various doped semiconductor materials and/or conductive materials. A bit line contact plug BPLG may be electrically connected to the vertical semiconductor pattern SP through the conductive pad PAD.

The source semiconductor layer SSL on the cell array region CAR may be in direct contact with a lower side surface of each of the vertical semiconductor patterns SP. The source semiconductor layer SSL may electrically connect the vertical semiconductor patterns SP on the cell array region CAR to each other. That is, the vertical semiconductor patterns SP of the vertical channel structures VS may be electrically connected to the second substrate SL. The second substrate SL may serve as a common source electrode of the memory cells. A common source voltage may be applied to the second substrate SL.

Each of the dummy structures DS may include the vertical insulating pattern VP, the vertical semiconductor pattern SP, and the gap-fill insulating pattern VI, similar to the vertical channel structures VS described above. However, the dummy structures DS may not serve as the channel region of the memory cell, unlike the vertical channel structures VS. The dummy structures DS may be electrically disconnected from bit lines BL and upper interconnection lines UIL, which will be described below. In other words, the dummy structures DS may be dummy elements that have no electrical function in respect of a circuitry. The dummy structures DS may serve as a pillar (i.e., a supporter) physically supporting the staircase structure STS of the electrode structure ST.

A plurality of separation structures SPS may be provided to penetrate the electrode structure ST. The separation structures SPS may be extended in the second direction D2 to be parallel to each other. When viewed in a plan view, each of the separation structures SPS may be a line- or bar-shaped pattern extending in the second direction D2. For example, referring to FIG. 4B, each of the electrodes EL may be horizontally divided into a plurality of electrode patterns by the separation structures SPS. The separation structures SPS may be formed of or include an insulating material (e.g., silicon oxide).

Referring back to FIG. 4B, each separation structure SPS of the cell array region CAR may include a lower portion, which is provided in the source semiconductor layer SSL and is horizontally expanded. A bottom surface of the separation structure SPS of the cell array region CAR may be coplanar with a bottom surface of the source semiconductor layer SSL.

Referring back to FIG. 4C, a portion of the upper semiconductor layer USL on the connection region CNR may be in direct contact with the lower semiconductor layer LSL. The separation structure SPS of the connection region CNR may be provided to penetrate the portion of the upper semiconductor layer USL and may be extended into the lower semiconductor layer LSL. A bottom surface of the separation structure SPS of the connection region CNR may be lower than a top surface of the lower semiconductor layer LSL.

The three-dimensional semiconductor memory device according to an embodiment of the inventive concept may be a three-dimensional NAND FLASH memory device. Cell strings of the NAND FLASH memory device may be integrated in the electrode structure ST on the second substrate SL. The electrode structure ST and the vertical channel structures VS penetrating the electrode structure ST may constitute memory cells, which are three-dimensionally arranged on the second substrate SL. The electrodes EL of the electrode structure ST may be used as gate electrodes of transistors.

A third interlayer insulating layer ILD3 may be provided on the second interlayer insulating layer ILD2. The bit line contact plugs BPLG may be provided to penetrate the third interlayer insulating layer ILD3 and may be coupled to the conductive pads PAD, respectively. The bit lines BL may be disposed on the third interlayer insulating layer ILD3. The bit lines BL may be extended in the first direction D1 to be parallel to each other. The bit lines BL may be electrically connected to the vertical channel structures VS through the bit line contact plugs BPLG.

Cell contact plugs PLG may be provided to penetrate the second and third interlayer insulating layers ILD2 and ILD3 and may be respectively coupled to the electrodes EL constituting the staircase structure STS. The upper interconnection lines UIL may be disposed on the third interlayer insulating layer ILD3. The upper interconnection lines UIL may be electrically connected to the electrodes EL, respectively, through the cell contact plugs PLG. Although not shown, the bit lines BL and the upper interconnection lines UIL may be electrically connected to the lower interconnection lines INL of the peripheral circuit structure PS through the penetration contacts.

A lower structure of the vertical channel structure VS will be described in more detail with reference to FIGS. 4A and 5A. The vertical semiconductor pattern SP of the vertical channel structure VS may include an upper semiconductor pattern USP, a lower semiconductor pattern LSP, and a middle semiconductor pattern MSP therebetween. The upper semiconductor pattern USP may be located at a level higher than the top surface of the upper semiconductor layer USL. The lower semiconductor pattern LSP may be located at a level lower than the bottom surface of the upper semiconductor layer USL. The middle semiconductor pattern MSP may be located at substantially the same level as the upper semiconductor layer USL.

The upper semiconductor pattern USP may serve as the channel region of the three-dimensional NAND FLASH memory device described above. A channel region of the upper semiconductor pattern USP may have a first thickness T1. An outer diameter of the upper semiconductor pattern USP may have a first diameter DI1. The first diameter DI1 may be greater than two times the first thickness T1.

The middle semiconductor pattern MSP may connect the upper and lower semiconductor patterns USP and LSP to each other. The middle semiconductor pattern MSP may have a second diameter DI2 which is smaller than the first diameter DI1. The diameter of the middle semiconductor pattern MSP may decrease from the upper semiconductor pattern USP toward the lower semiconductor pattern LSP, may reach the smallest value DI2_b between the upper and lower semiconductor patterns USP and LSP, and then may increase with decreasing distance from the lower semiconductor pattern LSP. In other words, the middle semiconductor pattern MSP may have a bottleneck-shaped or hourglass-shaped structure.

An upper diameter DI2_a of the middle semiconductor pattern MSP may be greater than the smallest diameter DI2_b of the middle semiconductor pattern MSP. A lower diameter DI2_c of the middle semiconductor pattern MSP may be greater than the smallest diameter DI2_b of the middle semiconductor pattern MSP. The smallest diameter DI2_b of the middle semiconductor pattern MSP may be greater than the first thickness T1 of the channel region of the upper semiconductor pattern USP. The first thickness T1 of the channel region of the upper semiconductor pattern USP may range from 2 nanometers (nm) to 5 nm. The smallest diameter DI2_b of the middle semiconductor pattern MSP may range from 5 nm to 15 nm.

The lower semiconductor pattern LSP may have a third diameter DI3, which is greater than the second diameter DI2. The third diameter DI3 of the lower semiconductor pattern LSP may be gradually decreased with decreasing distance from the bottom surface of the lower semiconductor layer LSL. The lower semiconductor pattern LSP may include a void VD provided therein.

The gap-fill insulating pattern VI may be spaced apart from the lower semiconductor pattern LSP in the third direction D3, with the middle semiconductor pattern MSP interposed therebetween. A lowermost point LWP of the gap-fill insulating pattern VI may be located at a level higher than the lower semiconductor pattern LSP. The lowermost point LWP of the gap-fill insulating pattern VI may be located at a level between the top and bottom surfaces of the upper semiconductor layer USL (e.g., at a level between the top and bottom surfaces of the middle semiconductor pattern MSP). In an embodiment, although not shown, the lowermost point LWP of the gap-fill insulating pattern VI may be located at a level higher than the top surface of the upper semiconductor layer USL.

A sidewall oxide pattern SOP may be interposed between the middle semiconductor pattern MSP and the upper semiconductor layer USL. A bottom oxide pattern BOP may be interposed between the lower semiconductor pattern LSP and the lower semiconductor layer LSL. Each of the sidewall and bottom oxide patterns SOP and BOP may be formed of or include silicon oxide.

The source semiconductor layer SSL may be in direct contact with the middle semiconductor pattern MSP and the lower semiconductor pattern LSP. The source semiconductor layer SSL may include a neck cover portion NEP, which is disposed below the sidewall oxide pattern SOP and is in contact (i.e., direct, physical contact) with the middle semiconductor pattern MSP. The neck cover portion NEP may be provided to surround a bottleneck portion (i.e., the middle semiconductor pattern MSP) of the vertical semiconductor pattern SP. For example, the neck cover portion NEP may have a scarf shape surrounding the neck portion of the vertical semiconductor pattern SP.

The neck cover portion NEP may have a first width W1 in the second direction D2. An upper width W1_a of the neck cover portion NEP may be greater than a lower width W1_b of the neck cover portion NEP. In other words, the width W1 of the neck cover portion NEP may be gradually decreased in a downward direction (e.g., from top to bottom).

The lowermost point LWP of the gap-fill insulating pattern VI filling an inner space of the upper semiconductor pattern USP may be located at a level higher than the bottom surface of the upper semiconductor layer USL. In an embodiment, the lowermost point LWP of the gap-fill insulating pattern VI may be located at a level between the top and bottom surfaces of the upper semiconductor layer USL.

Referring back to FIG. 4A, the voids VD, which are provided in lower portions of the vertical channel structures VS, may have different sizes. The voids VD may be provided at different levels. For example, the void VD of a first vertical channel structure VS may be aligned to a center of the first vertical channel structure VS, and the void VD of a second vertical channel structure VS may be horizontally offset from a center of the second vertical channel structure VS. The void VD of a third vertical channel structure VS may be in contact with the vertical insulating pattern VP.

A structure of a lower portion of the dummy structure DS will be described in more detail with reference to FIGS. 4A and 5B. The dummy structure DS may include an upper portion UPP, a lower portion LDP, and a middle portion MDP therebetween. The upper portion UPP may be located at a level higher than the top surface of the upper semiconductor layer USL. The lower portion LDP may be located at a level lower than the bottom surface of the upper semiconductor layer USL. The middle portion MDP may be located at substantially the same level as the upper semiconductor layer USL. The middle portion MDP may connect the upper portion UPP and the lower portion LDP to each other.

The upper portion UPP of the dummy structure DS may have a fourth diameter DI4. The middle portion MDP of the dummy structure DS may have a fifth diameter DI5, which is smaller than the fourth diameter DI4. The diameter of the middle portion MDP of the dummy structure DS may decrease from the upper portion UPP toward the lower portion LDP, may reach the smallest value DI5_b between the upper portion UPP and the lower portion LDP, and may increase with decreasing distance from the lower portion LDP. In other words, the middle portion MDP of the dummy structure DS may have a bottleneck (or hourglass) structure.

An upper diameter DI5_a of the middle portion MDP may be greater than the smallest diameter DI5_b of the middle portion MDP. A lower diameter DI5_c of the middle portion MDP may be greater than the smallest diameter DI5_b of the middle portion MDP.

The lower portion LDP of the dummy structure DS may have a sixth diameter DI6, which is greater than the fifth diameter DI5. The sixth diameter DI6 of the lower portion LDP of the dummy structure DS may be gradually decreased with decreasing distance from the bottom surface of the lower semiconductor layer LSL. The lower portion LDP of the dummy structure DS may include a void VD. The void VD of the dummy structure DS may be larger than the void VD of the vertical channel structure VS previously described with reference to FIG. 5A.

A sidewall oxide pattern SOP may be interposed between the middle portion MDP of the dummy structure DS and the upper semiconductor layer USL. A top surface of the sidewall oxide pattern SOP may be bordered by (e.g., covered with) the first insulating layer ILL and a bottom surface of the sidewall oxide pattern SOP may be bordered by (e.g., covered with) the fourth insulating layer IL4. A side surface of the sidewall oxide pattern SOP may be in contact with a side surface of the upper semiconductor layer USL, and another (e.g., opposite) side surface of the sidewall oxide pattern SOP may be in contact (i.e., direct, physical contact) with the vertical insulating pattern VP of the middle portion MDP. The other side surface of the sidewall oxide pattern SOP may be curved.

The sidewall oxide pattern SOP may have a second width W2 in the second direction D2. The second width W2 of the sidewall oxide pattern SOP may increase from the first insulating layer IL1 toward the fourth insulating layer IL4, may reach the largest value between the first insulating layer IL1 and the fourth insulating layer IL4, and may decrease with decreasing distance from the fourth insulating layer IL4. That is, the second width W2 of the sidewall oxide pattern SOP may vary depending on the sidewall profile (e.g., in inverse proportion to the fifth diameter DI5) of the middle portion MDP.

The largest width W2 of the sidewall oxide pattern SOP may range from 3 nm to 10 nm. Meanwhile, the smallest diameter DI2_b of the middle semiconductor pattern MSP previously described with reference to FIG. 5A may be 1 to 3 times the largest width W2 of the sidewall oxide pattern SOP.

FIGS. 6 to 11 are sectional views taken along the line I-I' of FIG. 3 to illustrate a method of fabricating a three-dimensional semiconductor memory device, according to an embodiment of the inventive concept. FIGS. 12A, 12B, and 12C are enlarged sectional views of a region 'M' of FIG. 10, which are provided to illustrate a method of forming a vertical channel structure, according to an embodiment of the inventive concept.

Figure 6:
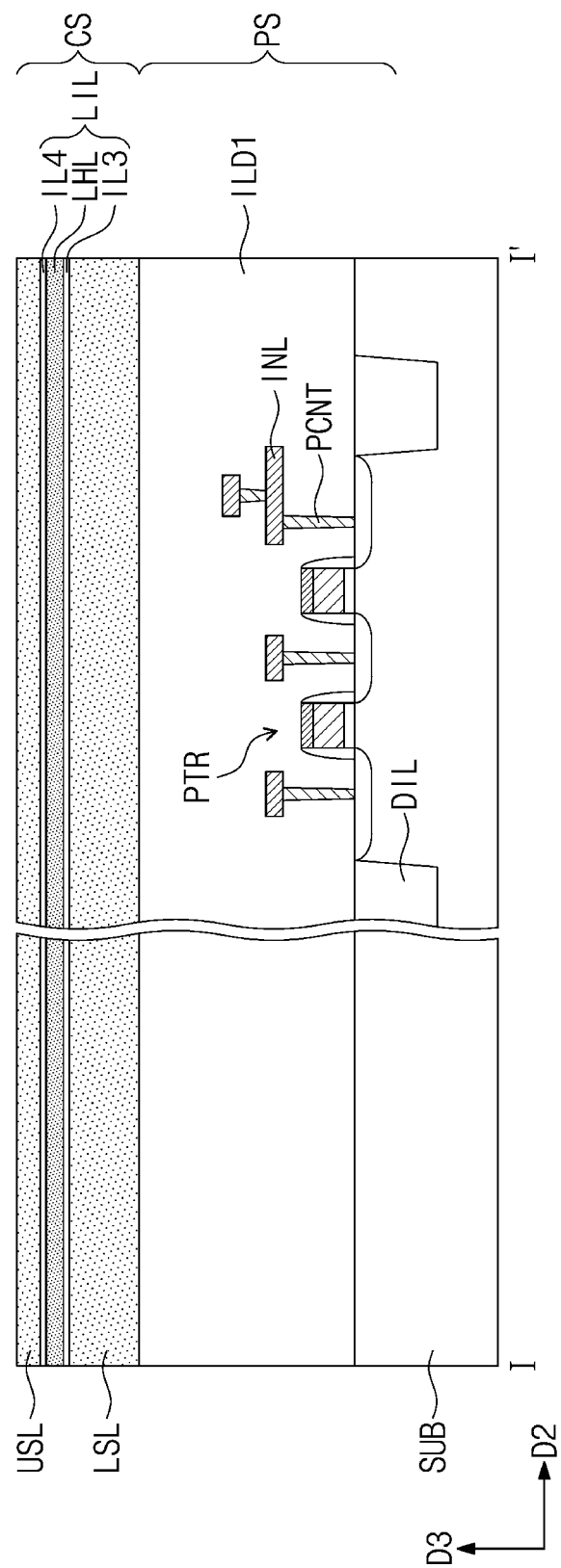
FIGS. 6 to 11 are sectional views taken along the line I-I' of FIG. 3 to illustrate a method of fabricating a three-dimensional semiconductor memory device, according to an embodiment of the inventive concept.

Referring to FIGS. 3 and 6, the peripheral circuit structure PS may be formed on the first substrate SUB. The formation of the peripheral circuit structure PS may include forming the peripheral transistors PTR on the first substrate SUB and forming the lower interconnection lines INL on the peripheral transistors PTR. For example, the formation of the peripheral transistors PTR may include forming the device isolation layer DIL on the first substrate SUB to define active regions, forming a gate insulating layer and a gate electrode on the active regions, and injecting impurities into the active regions to form source/drain regions. The first interlayer insulating layer ILD1 may be formed on (e.g., to cover) the peripheral transistors PTR and the lower interconnection lines INL.

The lower semiconductor layer LSL may be formed on the first interlayer insulating layer ILD1. For example, the lower semiconductor layer LSL may be formed of or include a semiconductor material, such as polysilicon. The lower insulating layer LIL may be formed on the lower semiconductor layer LSL. The formation of the lower insulating layer LIL may include sequentially forming the third insulating layer IL3, the lower sacrificial layer LHL, and the fourth insulating layer IL4 on the lower semiconductor layer LSL. The third and fourth insulating layers IL3 and IL4 may be formed of or include silicon oxide, and the lower sacrificial layer LHL may be formed of or include silicon nitride or silicon oxynitride.

The upper semiconductor layer USL may be conformally formed on the lower sacrificial layer LHL. For example, the upper semiconductor layer USL may be formed of or include a semiconductor material (e.g., polysilicon). As previously described with reference to FIG. 4C, a portion of the upper semiconductor layer USL on the connection region CNR may be formed to be in direct contact with the lower semiconductor layer LSL.

Figure 7:
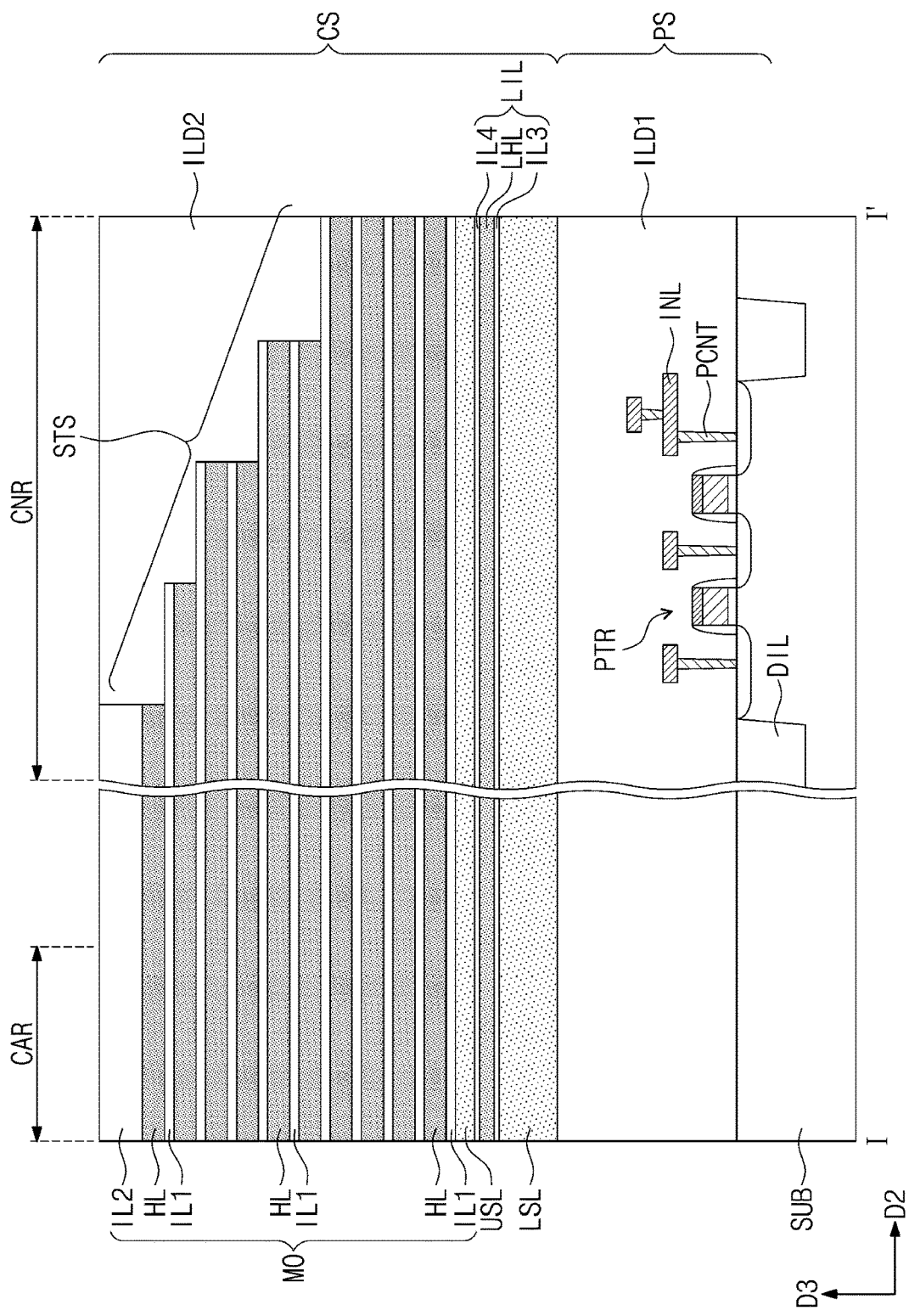

Referring to FIGS. 3 and 7, a mold structure MO may be formed on the upper semiconductor layer USL. In detail, the first insulating layers IL1 and sacrificial layers HL may be alternately stacked on the upper semiconductor layer USL to form the mold structure MO. The second insulating layer IL2 may be formed as the uppermost layer of the mold structure MO.

The first insulating layers ILL the sacrificial layers HL, and the second insulating layer IL2 may be deposited using at least one of thermal chemical vapor deposition, plasma-enhanced chemical vapor deposition, physical chemical vapor deposition, or atomic layer deposition (ALD) processes. The first and second insulating layers IL1 and IL2 may be formed of or include silicon oxide, and the sacrificial layers HL may be formed of or include silicon nitride or silicon oxynitride.

The staircase structure STS may be formed in the mold structure MO on the connection region CNR. In detail, the staircase structure STS may be formed on the connection region CNR by performing a cycle process on the mold structure MO. The formation of the staircase structure STS may include forming a mask pattern (not shown) on the mold structure MO and performing a cyclic patterning process using the mask pattern several times. Each cyclic patterning process may include etching a portion of the mold structure MO using the mask pattern as an etch mask and performing a trimming process of reducing a size of the mask pattern.

The second interlayer insulating layer ILD2 may be formed on the mold structure MO. The formation of the second interlayer insulating layer ILD2 may include forming an insulating layer on (e.g., to cover) the mold structure MO and performing a planarization process on the insulating layer to provide/expose the second insulating layer IL2.

Figure 8:
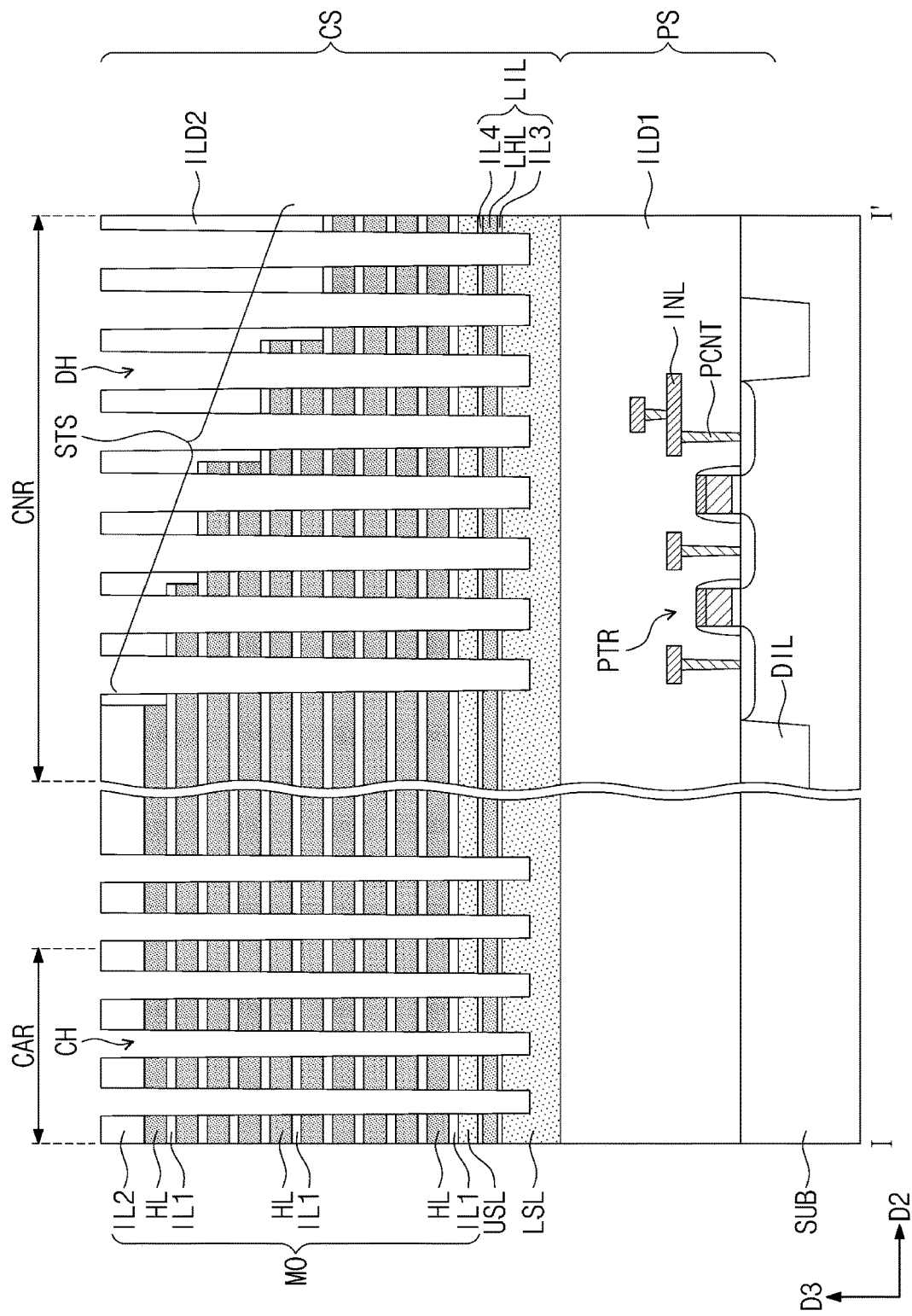

Referring to FIGS. 3 and 8, channel holes CH may be formed on the cell array region CAR to penetrate the mold structure MO. Dummy holes DH may be formed on the connection region CNR to penetrate the mold structure MO. The dummy holes DH may penetrate the staircase structure STS of the mold structure MO. Each of the channel and dummy holes CH and DH may be formed to expose the lower semiconductor layer LSL.

In detail, the formation of the channel and dummy holes CH and DH may include forming a mask pattern (not shown), in which openings defining positions and shapes of holes are formed, on the mold structure MO and anisotropically etching the mold structure MO using the mask pattern as an etch mask. The anisotropic etching process may include a plasma etching process, a reactive ion etching (RIE) process, an inductively-coupled plasma reactive ion etching (ICP-RIE) process, or an ion beam etching (IBE) process.

When viewed in a plan view, the channel holes CH may be arranged (e.g., may be collinear) in a direction or may be in a zigzag shape. The planar arrangement of the channel holes CH may be the same as that of the vertical channel structures VS previously described with reference to FIG. 3. The largest diameter of each of the channel holes CH may be smaller than the largest diameter of each of the dummy holes DH.

Figure 9:
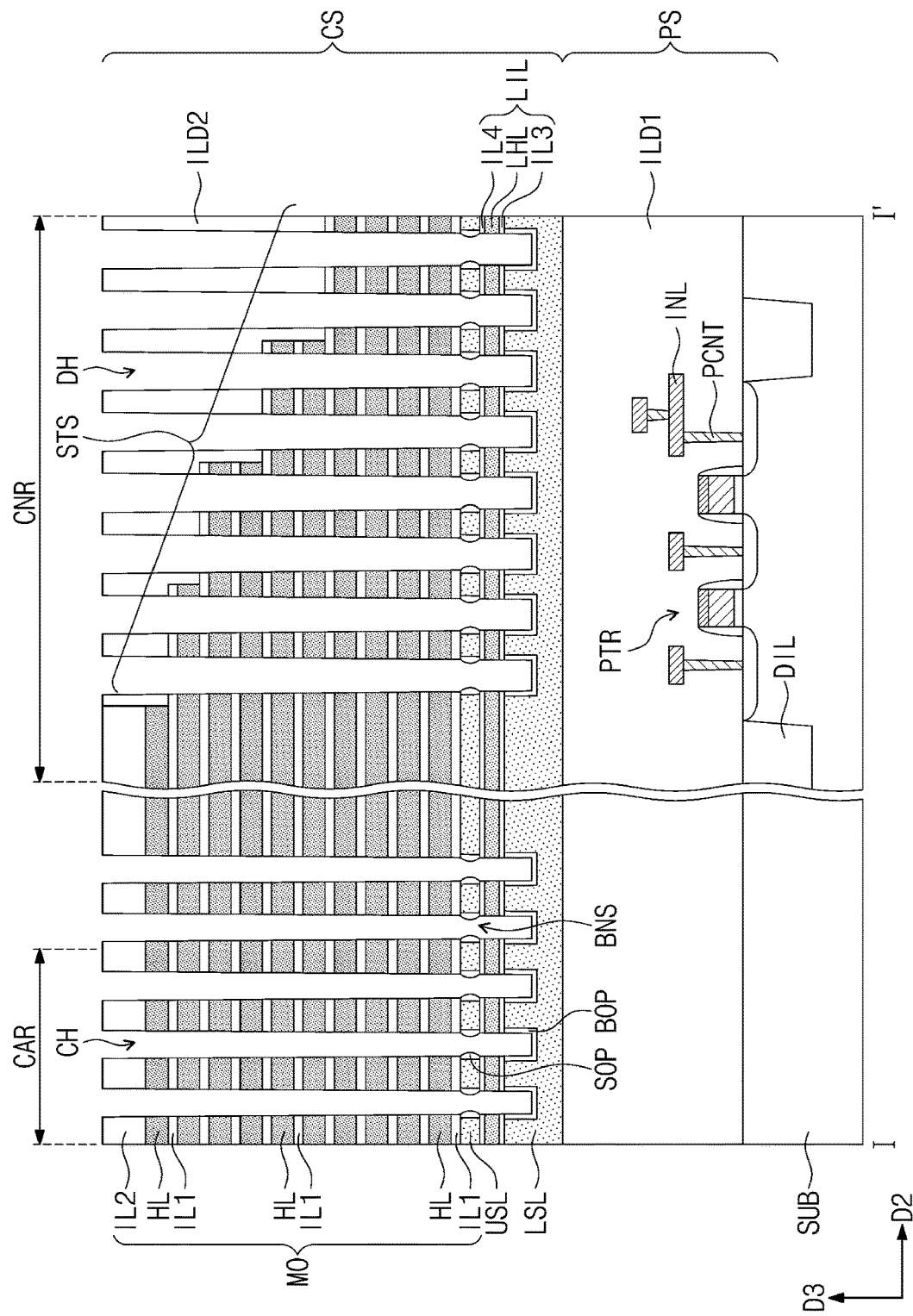

Referring to FIGS. 3 and 9, sidewall oxide patterns SOP and bottom oxide patterns BOP may be formed by selectively oxidizing a semiconductor material exposed through the channel and dummy holes CH and DH.

In detail, a side surface of the upper semiconductor layer USL and a top surface of the lower semiconductor layer LSL may be exposed through each of the channel and dummy holes CH and DH. A wet oxidation process (e.g., using water) or a dry oxidation process (e.g., using oxygen or ozone) may be performed on each of the channel and dummy holes CH and DH. In this case, the exposed side surface of the upper semiconductor layer USL may be oxidized to form the sidewall oxide pattern SOP. Also, the exposed top surface of the lower semiconductor layer LSL may be oxidized to form the bottom oxide pattern BOP. Each of the sidewall and bottom oxide patterns SOP and BOP may be formed of or include silicon oxide.

According to an embodiment of the inventive concept, since the sidewall oxide pattern SOP is formed in a lower region of the channel hole CH, the lower region of the channel hole CH may have a bottleneck (or hourglass) structure BNS whose diameter decreases and then increases.

Figure 10:
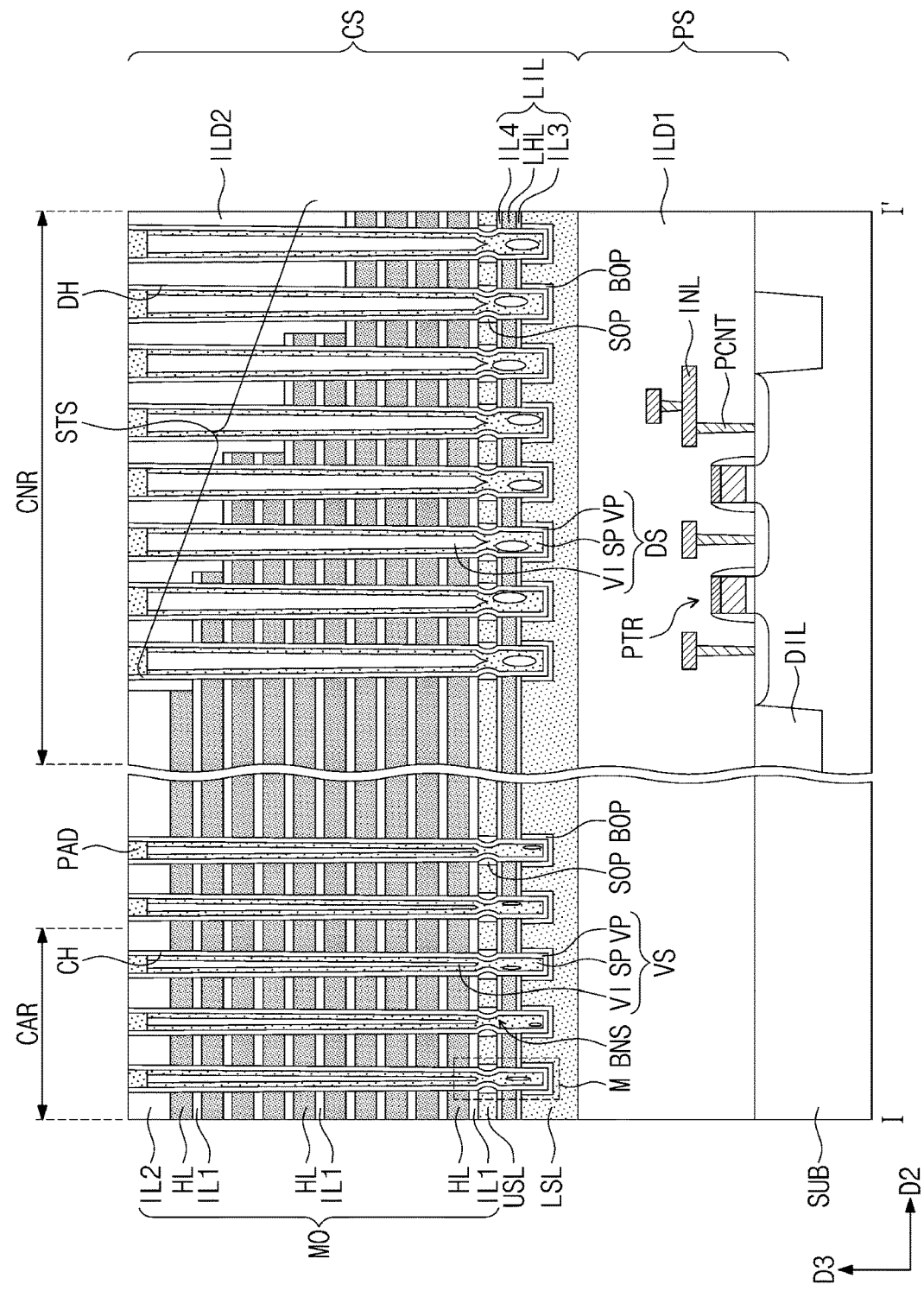

Referring to FIGS. 3 and 10, the vertical channel structures VS may be formed in the channel holes CH, respectively. The dummy structures DS may be formed in the dummy holes DH, respectively. The conductive pad PAD may be formed on or in an upper portion of each of the vertical channel structures VS and the dummy structures DS. In detail, the formation of the vertical channel structure VS will be described in more detail with reference to FIGS. 12A, 12B, and 12C.

Referring to FIG. 12A, the vertical insulating pattern VP may be formed on (e.g., to conformally cover) an inner surface of the channel hole CH. The formation of the vertical insulating pattern VP may include sequentially forming the blocking insulating layer BL, the charge storing layer CL, and the tunnel insulating layer TL in the channel hole CH.

Referring to FIG. 12B, the vertical semiconductor pattern SP may be formed in the channel hole CH on (e.g., to cover) the vertical insulating pattern VP. The formation of the vertical semiconductor pattern SP may include forming a poly-silicon layer in the channel hole CH. The poly-silicon layer may be conformally deposited to a second thickness T2.

Due to the bottleneck (or hourglass) structure BNS of the channel hole CH, a lower portion of the channel hole CH may be filled with the poly-silicon layer. The poly-silicon layer in (e.g., filling) the bottleneck (or hourglass) structure BNS may constitute the middle semiconductor pattern MSP. The lower semiconductor pattern LSP filled with the poly-silicon layer may be formed below the bottleneck (or hourglass) structure BNS. The poly-silicon layer may not fill completely the lower portion of the channel hole CH, and in this case, the void VD may be formed in the lower semiconductor pattern LSP. The upper semiconductor pattern USP, which is formed of the poly-silicon layer of the second thickness T2 and has a pipe shape, may be formed on the bottleneck (or hourglass) structure BNS.

Referring to FIG. 12C, a thermal treatment process may be performed on the vertical semiconductor pattern SP to crystallize the vertical semiconductor pattern SP. Thereafter, a trimming process may be performed on the vertical semiconductor pattern SP to reduce the second thickness T2 of the upper semiconductor pattern USP to the first thickness T1. Here, since the bottleneck (or hourglass) structure BNS of the channel hole CH is completely filled with the middle semiconductor pattern MSP, the trimming process may not cause a change in thickness of the middle semiconductor pattern MSP. In addition, since the lower semiconductor pattern LSP is protected by the middle semiconductor pattern MSP, the thickness of the lower semiconductor pattern LSP may not be changed by the trimming process. Thereafter, the gap-fill insulating pattern VI may be formed in the channel hole CH.

Referring back to FIGS. 3 and 10, the dummy structure DS in the dummy hole DH and the vertical channel structure VS may be concurrently formed. In other words, the dummy structure DS may be formed by substantially the same method as that for forming the vertical channel structure VS described with reference to FIGS. 12A, 12B, and 12C.

Figure 11:
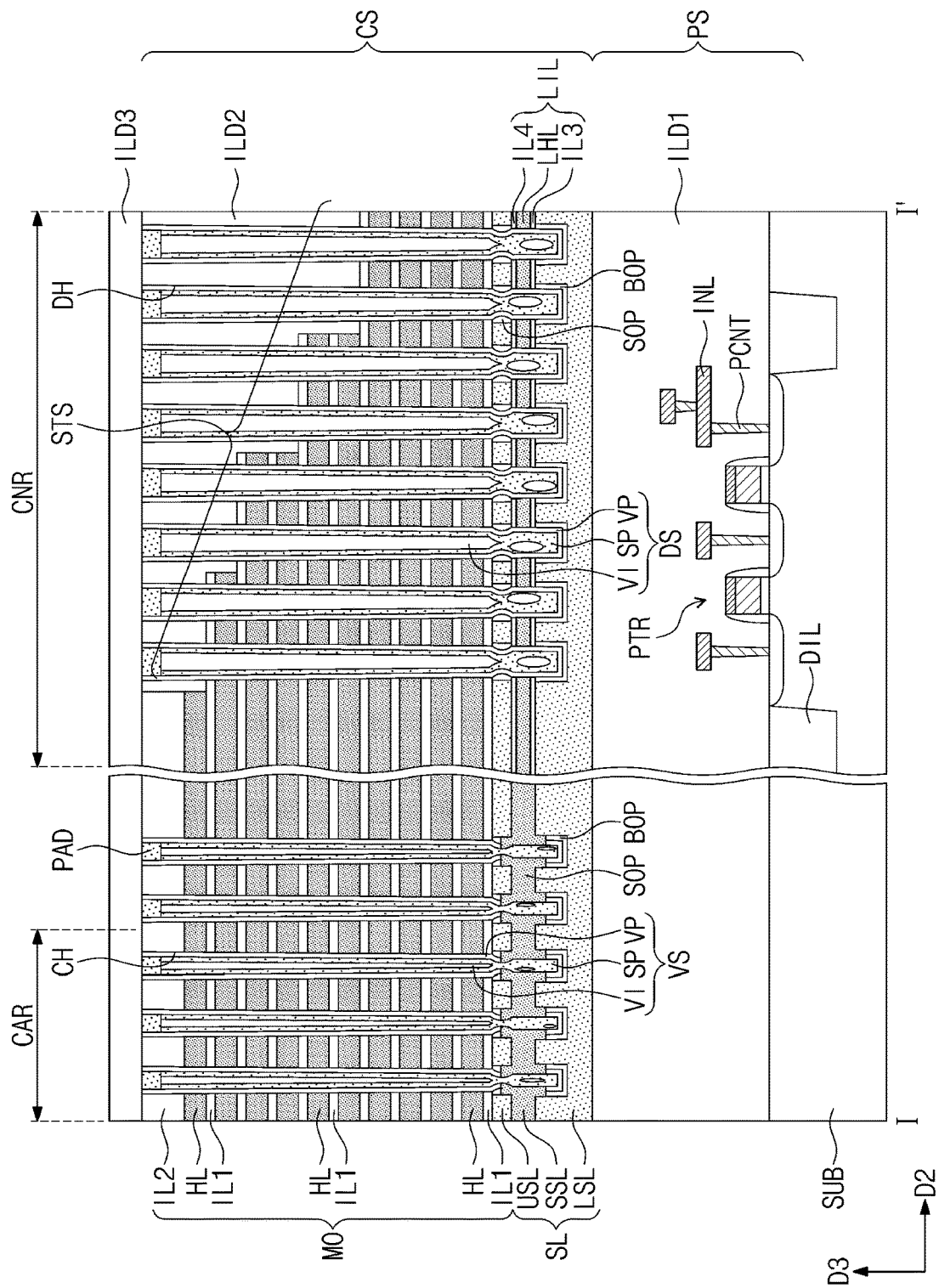
Figure 12A:
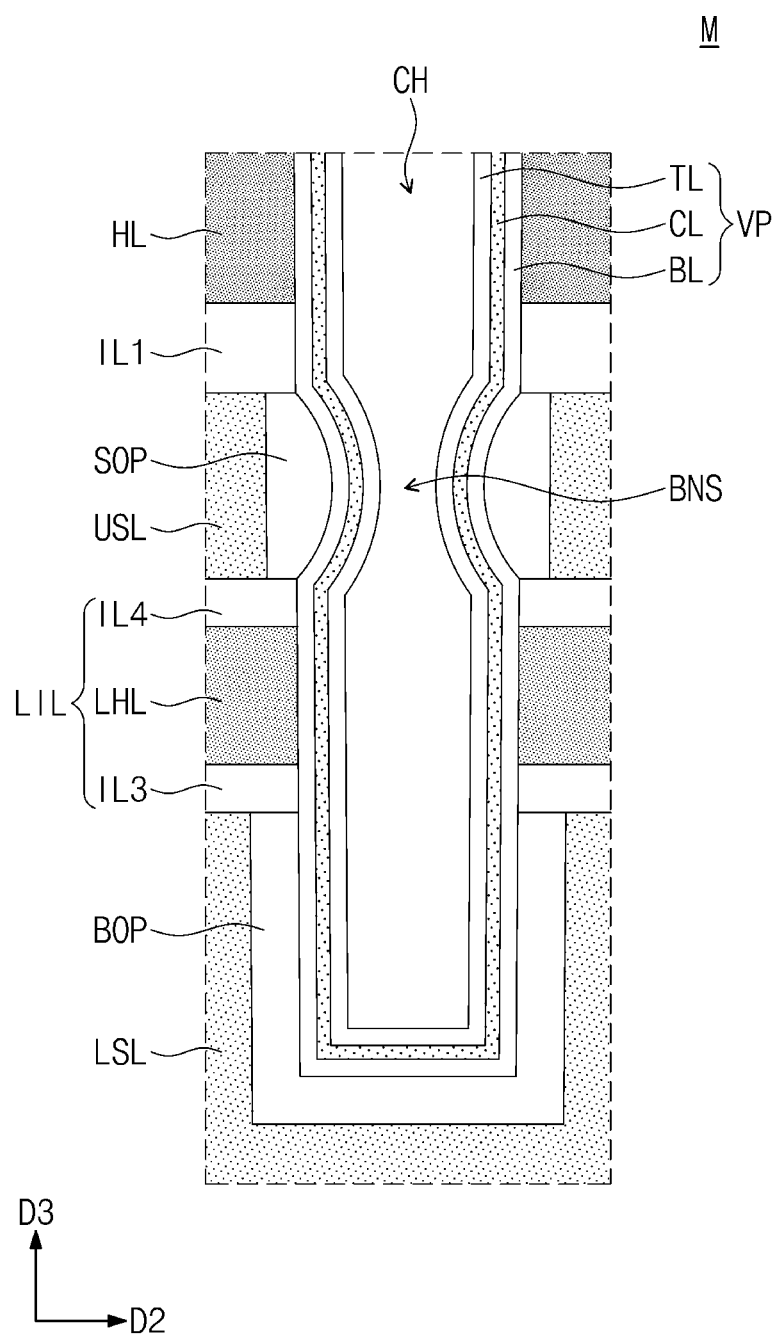
FIGS. 12A, 12B, and 12C are enlarged sectional views of a region 'M' of FIG. 10, which are provided to illustrate a method of forming a vertical channel structure, according to an embodiment of the inventive concept.
Figure 12B:
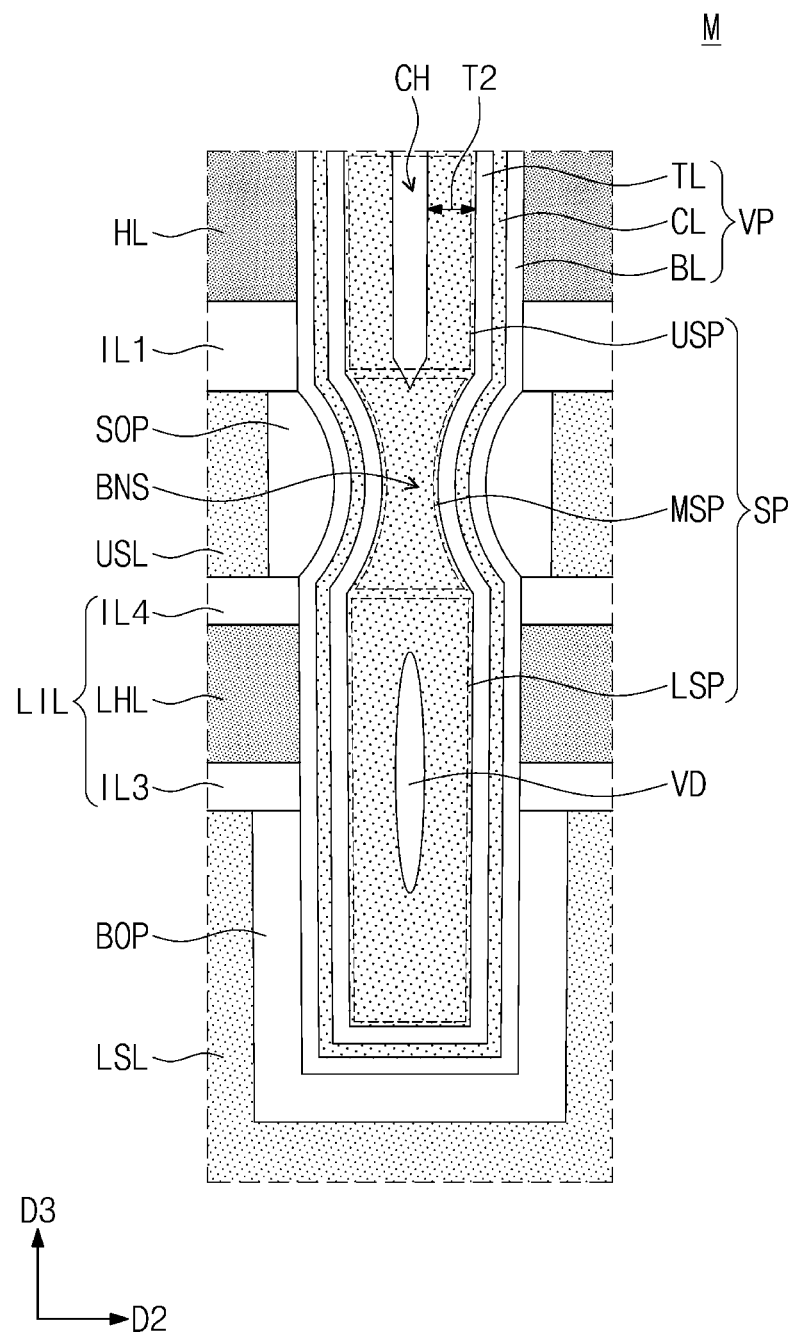
Figure 12C:
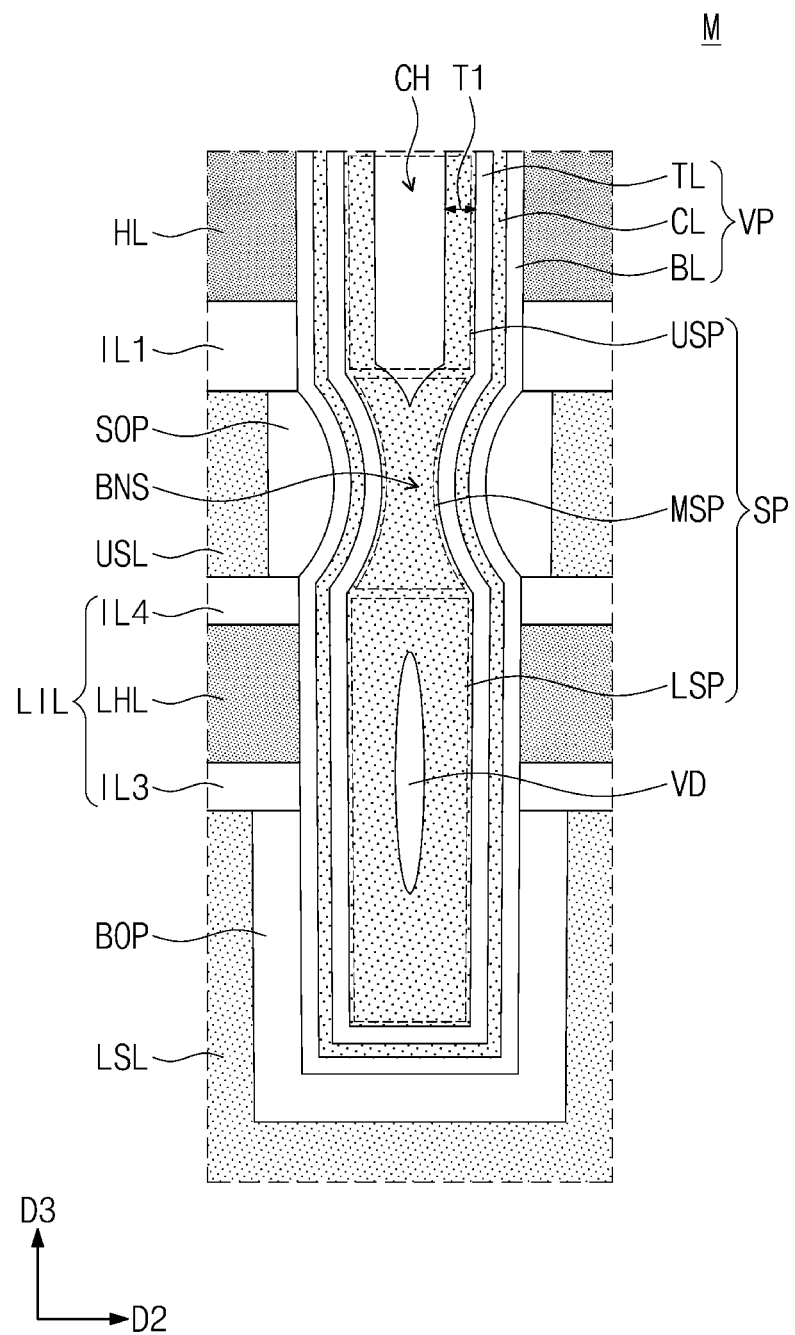

Referring to FIGS. 3 and 11, the third interlayer insulating layer ILD3 may be formed on the mold structure MO and the second interlayer insulating layer ILD2. The mold structure MO may be patterned to form cutting holes (not shown) penetrating the mold structure MO. Each cutting hole may correspond to a separation structure SPS described with reference to FIGS. 3, 4B, and 4C.

The cutting hole may be formed to expose the lower sacrificial layer LHL. The lower sacrificial layer LHL exposed by the cutting hole may be replaced with the source semiconductor layer SSL. In detail, the lower sacrificial layer LHL may be selectively removed through the cutting hole. As a result of the removal of the lower sacrificial layer LHL, a lower portion of the vertical insulating pattern VP may be exposed. The exposed lower portion of the vertical insulating pattern VP may be selectively removed. Accordingly, a lower portion of the vertical semiconductor pattern SP may be exposed. The third insulating layer IL3 and the fourth insulating layer IL4 may also be removed during the removal of the lower portion of the vertical insulating pattern VP. A portion of the sidewall oxide pattern SOP and a portion of the bottom oxide pattern BOP may also be removed during the removal of the lower portion of the vertical insulating pattern VP.

The source semiconductor layer SSL may be formed in a space which is formed by removing the lower insulating layer LIL. The source semiconductor layer SSL may be in direct contact with the exposed portion of the vertical semiconductor pattern SP. In detail, referring back to FIG. 5A, the source semiconductor layer SSL may be in direct contact with the middle semiconductor pattern MSP and the lower semiconductor pattern LSP. The lower semiconductor layer LSL, the source semiconductor layer SSL, and the upper semiconductor layer USL may constitute the second substrate SL.

Meanwhile, the lower sacrificial layer LHL on the connection region CNR may not be removed. In this case, the source semiconductor layer SSL may not be formed on the connection region CNR.

Referring back to FIGS. 3, 4A, 4B, and 4C, the electrode structure ST may be formed by replacing the sacrificial layers HL, which are exposed by the cutting hole, with the electrodes EL, respectively. In detail, the sacrificial layers HL, which are exposed through the cutting hole, may be selectively removed. The electrodes EL may be respectively formed in spaces which are formed by the removing of the sacrificial layers HL. Thereafter, a separation structure may be formed in the cutting hole by filling the cutting hole with an insulating material.

The bit line contact plugs BPLG may be formed on the cell array region CAR to penetrate the third interlayer insulating layer ILD3 and to be respectively coupled to the conductive pads PAD. The cell contact plugs PLG may be formed on the connection region CNR to penetrate the second and third interlayer insulating layers ILD2 and ILD3 and to be respectively coupled to the electrodes EL of the staircase structure STS. The bit lines BL and the upper interconnection lines UIL, which are electrically connected to the bit line contact plugs BPLG and the cell contact plugs PLG, respectively, may be formed on the third interlayer insulating layer ILD3.

Figure 13A:
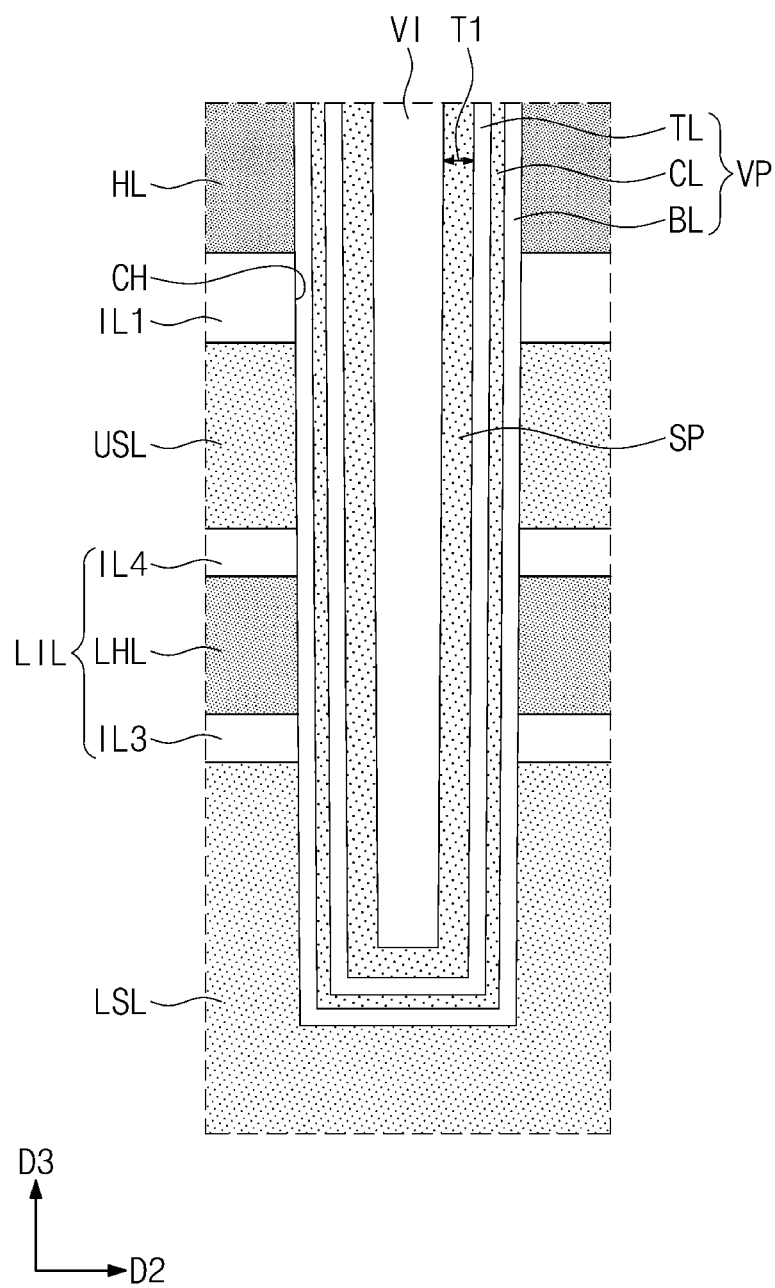
FIGS. 13A, 13B, and 13C are sectional views illustrating a method of forming a vertical channel structure, according to a comparative example of the inventive concept.
Figure 13B:
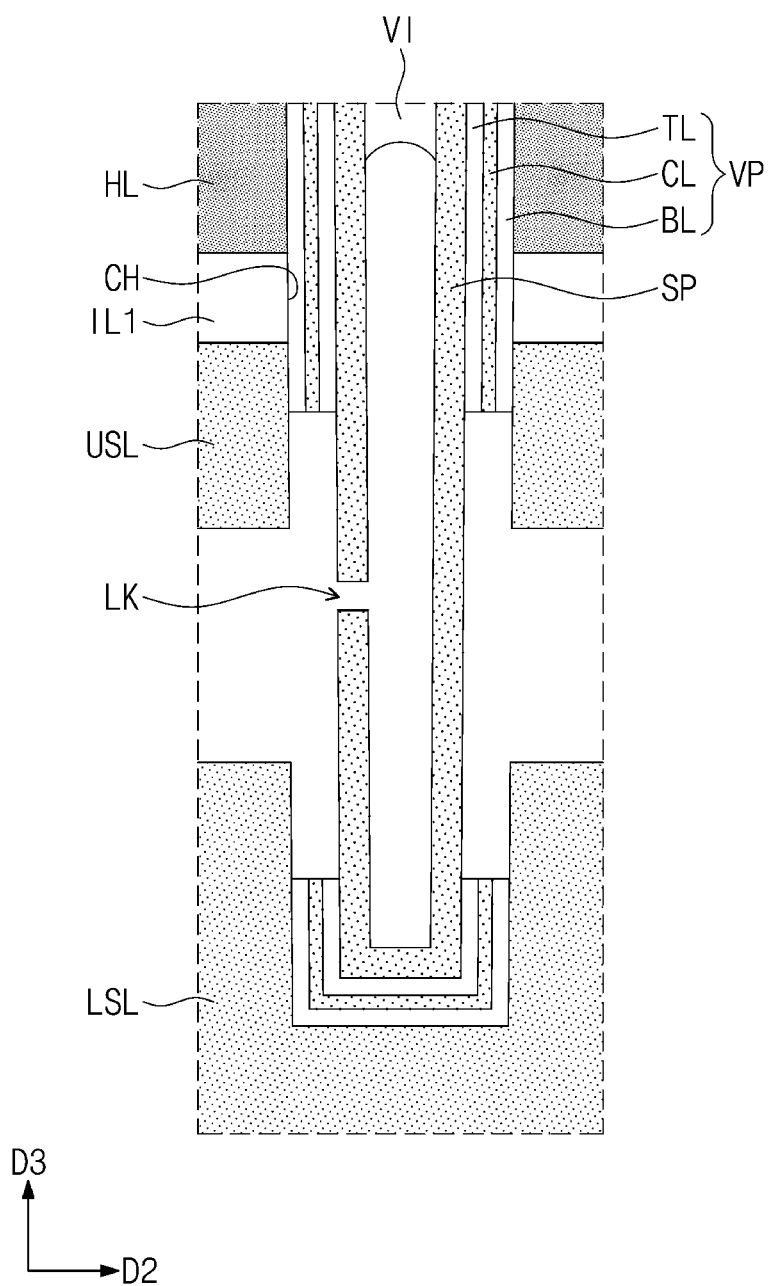
Figure 13C:
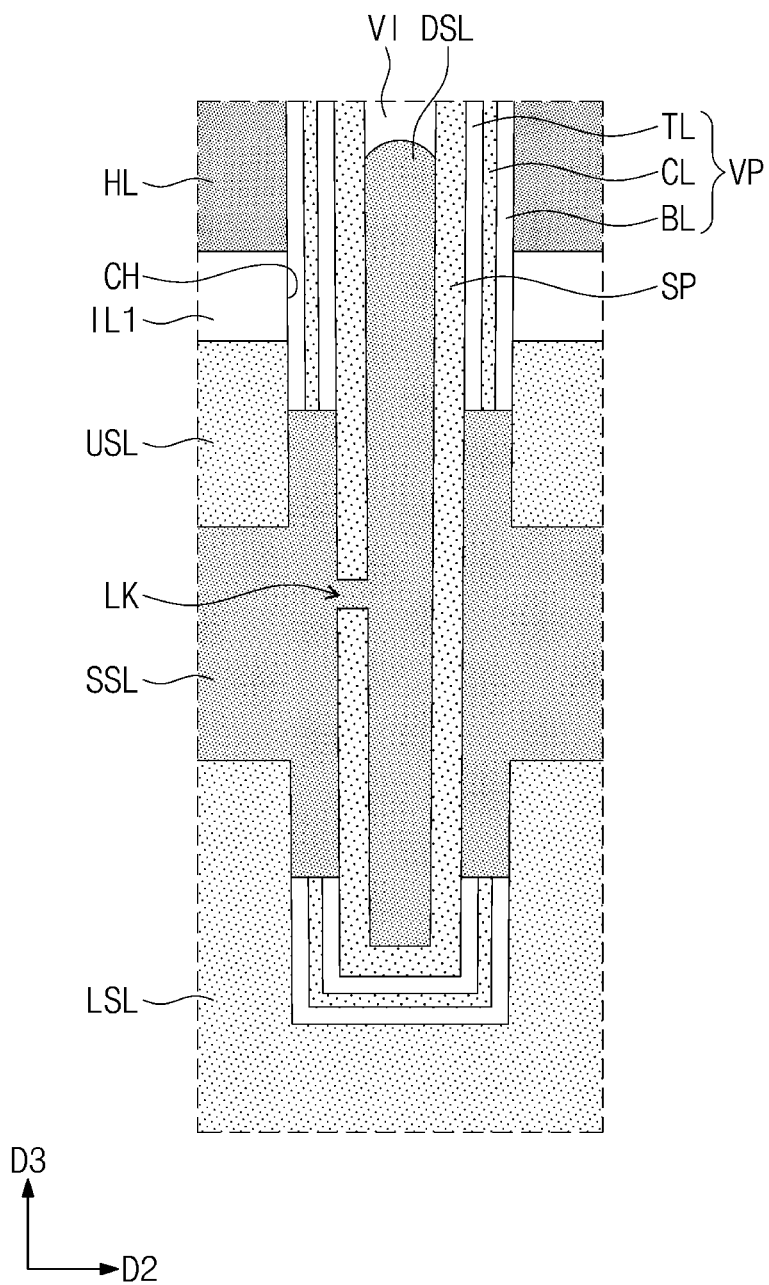

FIGS. 13A, 13B, and 13C are sectional views illustrating a method of forming a vertical channel structure, according to a comparative example of the inventive concept. A process defect, which may occur in a process of forming the vertical channel structure when the formation of the sidewall and bottom oxide patterns SOP and BOP described with reference to FIG. 9 is omitted, will be described below.

Referring to FIG. 13A, the vertical insulating pattern VP may be formed in the channel hole CH without the bottleneck (or hourglass) structure. The vertical semiconductor pattern SP may be formed on the vertical insulating pattern VP. According to this comparative example, since the channel hole CH does not have the bottleneck (or hourglass) structure, the vertical semiconductor pattern SP may be formed in the channel hole CH conformally (e.g., with the constant thickness T1). Thereafter, the gap-fill insulating pattern VI may be formed on the vertical semiconductor pattern SP.

Referring to FIG. 13B, the lower sacrificial layer LHL may be removed. Thereafter, a lower portion of the vertical insulating pattern VP may be removed. The third insulating layer IL3 and the fourth insulating layer IL4 may also be removed during the removing of the lower portion of the vertical insulating pattern VP. Since the vertical semiconductor pattern SP is formed to have a relatively small thickness T1, a leak LK may be formed in the vertical semiconductor pattern SP during an etching process to remove the lower portion of the vertical insulating pattern VP. An etching material may be supplied to the gap-fill insulating pattern VI through the leak LK of the vertical semiconductor pattern SP, and in this case, a portion of the gap-fill insulating pattern VI may be removed.

Referring to FIG. 13C, the source semiconductor layer SSL may be formed in a space, which is formed by removing the lower insulating layer LIL. During the formation of the source semiconductor layer SSL, a polysilicon layer may be formed in a space, which is formed by the removing of the gap-fill insulating pattern VI, through the leak LK of the vertical semiconductor pattern SP. The polysilicon layer, which is formed in the space formed by the removal of the gap-fill insulating pattern VI, may constitute an inner semiconductor layer DSL.

The inner semiconductor layer DSL may be an n+ polysilicon layer, like the source semiconductor layer SSL. The inner semiconductor layer DSL may be in direct contact with a channel region of the vertical semiconductor pattern SP, which is provided on the upper semiconductor layer USL. In the case where the channel region of the three-dimensional NAND FLASH memory device is in direct contact with the n-type polysilicon material, impurities in the polysilicon material may be diffused into the channel region, and this may lead to a failure of the semiconductor device.

By contrast, in the afore-described fabricating method of a semiconductor memory device according to an embodiment of the inventive concept, the bottleneck (or hourglass) structure BNS may be formed in the channel hole CH using the sidewall oxide pattern SOP. Accordingly, the middle semiconductor pattern MSP may be formed in (e.g., to completely fill) the bottleneck (or hourglass) structure BNS of the channel hole CH. Thus, the middle semiconductor pattern MSP may reduce/prevent infiltration of the n-type polysilicon during the formation of the source semiconductor layer SSL. Accordingly, it may be possible to impede/prevent the afore-described process defect and thereby to improve reliability and electric characteristics of the semiconductor memory device.

Figure 14:
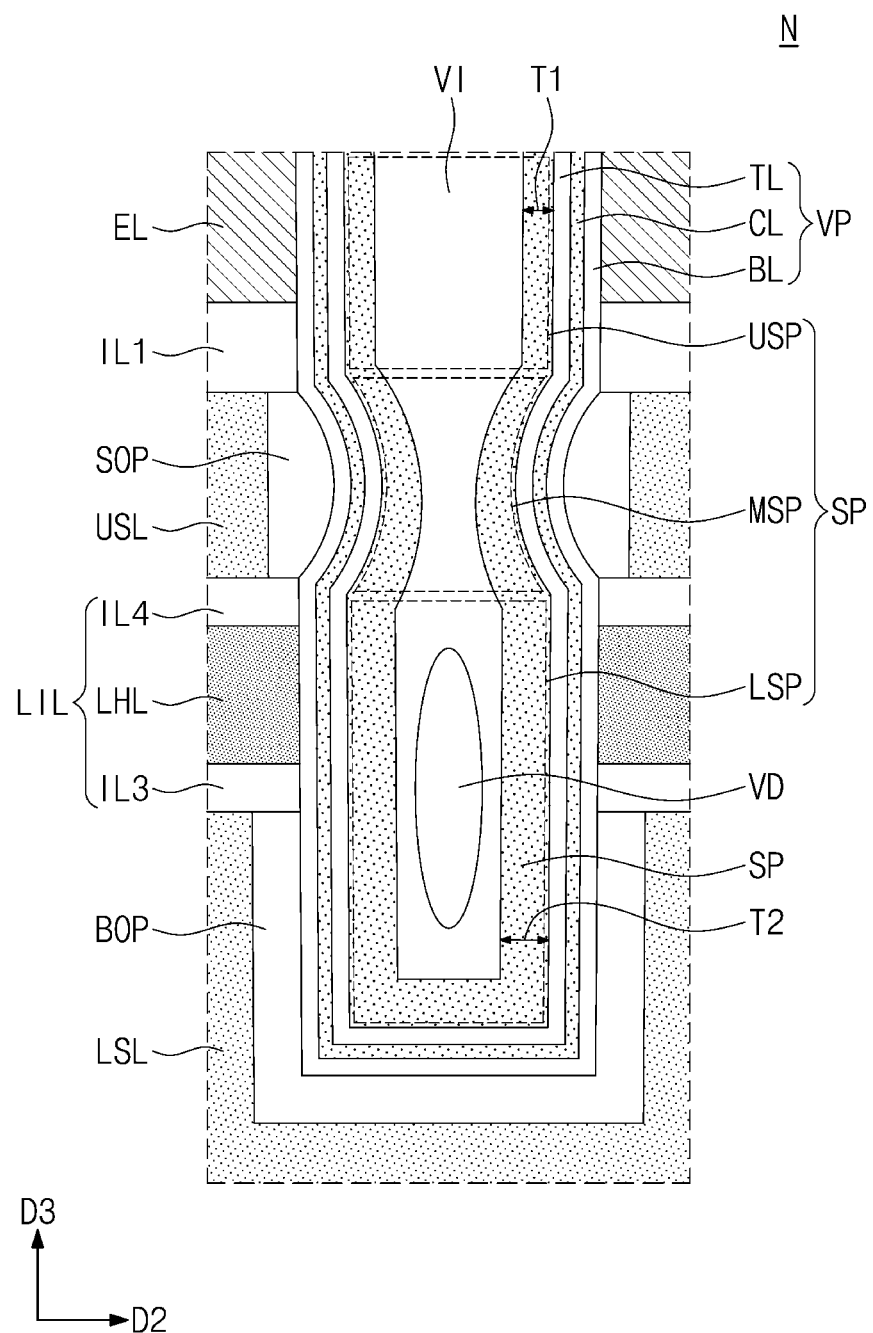
FIG. 14 is a sectional view of the region 'N' of FIG. 4A, which is provided to illustrate a semiconductor memory device according to an embodiment of the inventive concept.

FIG. 14 is a sectional view of the region 'N' of FIG. 4A, which is provided to illustrate a semiconductor memory device according to an embodiment of the inventive concept. In the following description, an element previously described with reference to FIGS. 4A and 5B may be identified by the same reference number without repeating an overlapping description thereof.

Another example of the lower structure of the dummy structure will be described in more detail with reference to FIG. 14.

The vertical semiconductor pattern SP of the dummy structure DS may include the upper semiconductor pattern USP, the lower semiconductor pattern LSP, and the middle semiconductor pattern MSP therebetween. The upper semiconductor pattern USP may be located at a level higher than the top surface of the upper semiconductor layer USL. The lower semiconductor pattern LSP may be located at a level lower than the bottom surface of the upper semiconductor layer USL. The middle semiconductor pattern MSP may be located at substantially the same level as the upper semiconductor layer USL. The middle semiconductor pattern MSP may be adjacent to the sidewall oxide pattern SOP.

The dummy structure DS may include the gap-fill insulating pattern VI, which is provided on an inner surface of the vertical semiconductor pattern SP. A bottom surface of the gap-fill insulating pattern VI may be in contact with a bottom portion of the lower semiconductor pattern LSP. According to the present embodiment, the gap-fill insulating pattern VI may not be spaced apart from the lower semiconductor pattern LSP and may be in contact with the lower semiconductor pattern LSP, unlike that shown in FIG. 5B. In an embodiment, the gap-fill insulating pattern VI in (e.g., filling) an internal space of the lower semiconductor pattern LSP may include the void VD.

The upper semiconductor pattern USP of the dummy structure DS may have the first thickness T1. The lower semiconductor pattern LSP of the dummy structure DS may have the second thickness T2. The first thickness T1 may be smaller than the second thickness T2. In other words, the thickness of the vertical semiconductor pattern SP of the dummy structure DS may be increased in a direction from the upper semiconductor pattern USP to the lower semiconductor pattern LSP.

The method of forming the dummy structure DS according to the present embodiment may include performing a trimming process on the vertical semiconductor pattern SP, as previously described with reference to FIG. 12C. Here, due to the bottleneck (or hourglass) structure of the middle semiconductor pattern MSP, the lower semiconductor pattern LSP provided below the middle semiconductor pattern MSP may not be affected by the trimming process. Thus, the lower semiconductor pattern LSP may have a relatively large thickness (e.g., the second thickness T2).

Figure 15:
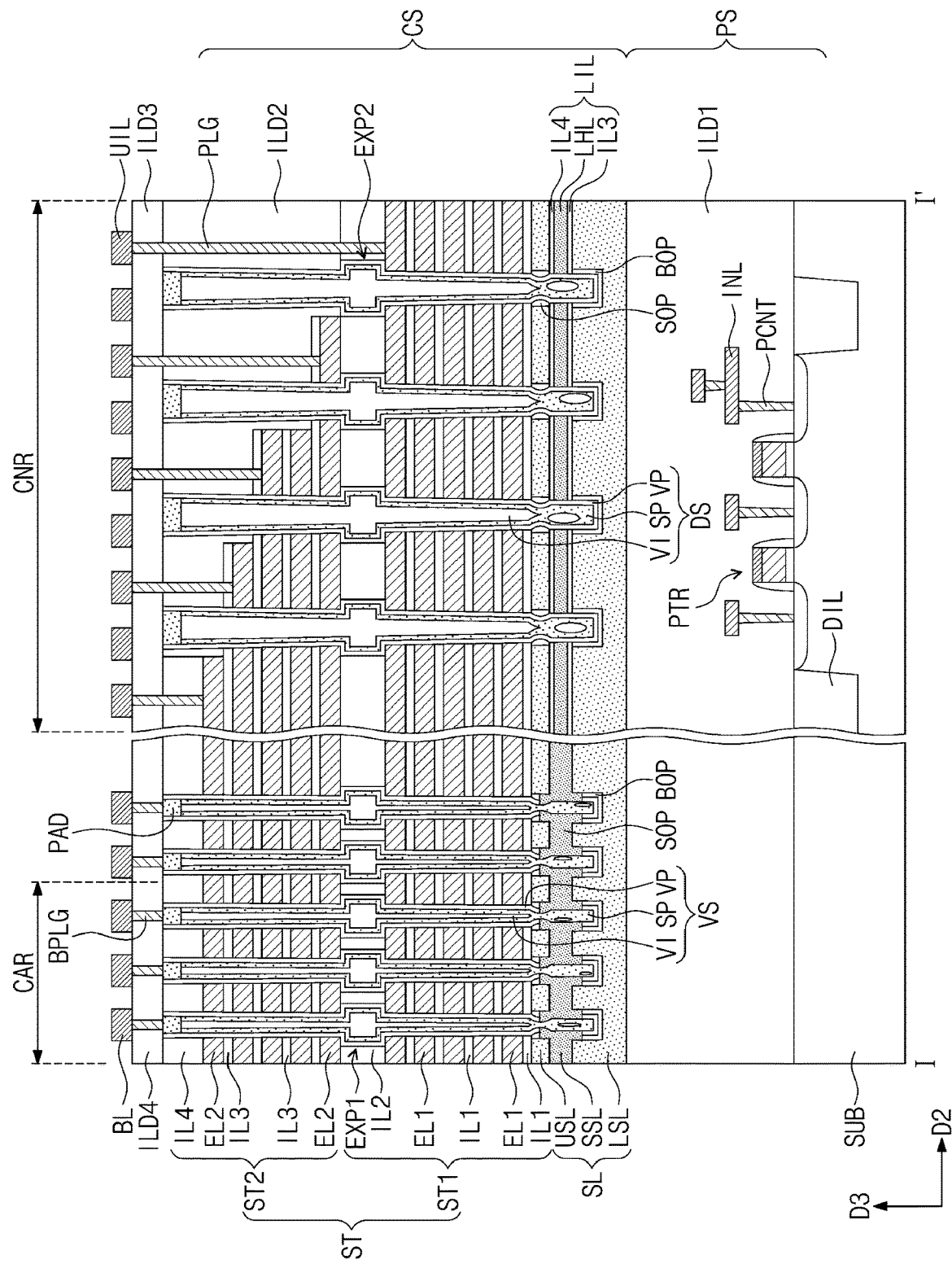
FIG. 15 is a sectional view taken along the line I-I' of FIG. 3 to illustrate a semiconductor memory device according to an embodiment of the inventive concept.

FIG. 15 is a sectional view taken along the line I-I' of FIG. 3 to illustrate a semiconductor memory device according to an embodiment of the inventive concept. In the following description, an element previously described with reference to FIG. 3 and FIGS. 4A to 4C may be identified by the same reference number without repeating an overlapping description thereof.

Referring to FIGS. 3 and 15, the electrode structure ST on the second substrate SL may include a first electrode structure ST1 and a second electrode structure ST2 on the first electrode structure ST1.

The first electrode structure ST1 may include first electrodes EL1, which are stacked on the second substrate SL in a direction perpendicular to the second substrate SL (i.e., in the third direction D3). The first electrode structure ST1 may further include the first insulating layers IL1 separating the first electrodes EL1 from each other. The first insulating layers IL1 and the first electrodes EL1 of the first electrode structure ST1 may be alternately stacked in the third direction D3. The second insulating layer IL2 may be provided as the topmost layer of the first electrode structure ST1. The second insulating layer IL2 may be thicker than each of the first insulating layers IL1.

The second electrode structure ST2 may include second electrodes EL2, which are stacked on the first electrode structure ST1 in the third direction D3. The second electrode structure ST2 may further include the third insulating layers IL3 separating the second electrodes EL2 from each other. The third insulating layers IL3 and the second electrodes EL2 of the second electrode structure ST2 may be alternately stacked in the third direction D3. The fourth insulating layer IL4 may be provided as the topmost layer of the second electrode structure ST2. The fourth insulating layer IL4 may be thicker than each of the third insulating layers IL3.

Each of the vertical channel structures VS may include a first vertical extended portion penetrating the first electrode structure ST1, a second vertical extended portion penetrating the second electrode structure ST2, and a first expanding portion EXP1 between the first and second vertical extended portions. The first expanding portion EXP1 may be provided in the second insulating layer IL2. A diameter of the vertical channel structure VS may be abruptly increased at the first expanding portion EXP1.

Each of the dummy structures DS may include a first vertical extended portion penetrating the first electrode structure ST1, a second vertical extended portion penetrating the second electrode structure ST2, and a second expanding portion EXP2 between the first and second vertical extended portions. The second expanding portion EXP2 may be provided in the second insulating layer IL2. A diameter of the dummy structure DS may be abruptly increased at the second expanding portion EXP2.

In a semiconductor memory device according to an embodiment of the inventive concept, a vertical structure penetrating an electrode structure may have a bottleneck (or hourglass) structure. The bottleneck (or hourglass) structure may effectively impede/prevent diffusion of an n+ polysilicon material supplied from a substrate. Accordingly, it may be possible to improve reliability and electric characteristics of the semiconductor memory device.

While example embodiments of the inventive concept have been particularly shown and described, it will be understood by one of ordinary skill in the art that variations in form and detail may be made therein without departing from the scope of the attached claims.

What is claimed is:
1. A semiconductor memory device comprising:
a substrate with a cell array region and a connection region;
an electrode structure including electrodes that are stacked on the substrate, the electrode structure having a staircase structure on the connection region;
a vertical channel structure penetrating the electrode structure on the cell array region to be electrically connected to the substrate;
a dummy structure penetrating the staircase structure on the connection region; and
a first sidewall oxide pattern interposed between the substrate and the dummy structure,
wherein the dummy structure includes an upper portion that is above the substrate, a middle portion that is in contact with the first sidewall oxide pattern, and a lower portion that is below the middle portion, and
wherein with increasing vertical distance from the upper portion, a diameter of the middle portion decreases until it reaches its smallest value and then increases.

2. The semiconductor memory device of claim 1,
wherein the vertical channel structure comprises a vertical semiconductor pattern that is extends vertically from the substrate,
wherein the vertical semiconductor pattern includes a lower semiconductor pattern electrically connected to the substrate, an upper semiconductor pattern on the lower semiconductor pattern, and a middle semiconductor pattern between the lower semiconductor pattern and the upper semiconductor pattern, and
wherein with increasing vertical distance from the upper semiconductor pattern, a diameter of the middle semiconductor pattern decreases until it reaches its smallest value and then increases.

3. The semiconductor memory device of claim 2, further comprising a second sidewall oxide pattern interposed between the substrate and the vertical channel structure,
wherein the substrate comprises a lower semiconductor layer, a source semiconductor layer, and an upper semiconductor layer that are sequentially stacked, and
wherein the second sidewall oxide pattern is interposed between the upper semiconductor layer and the middle semiconductor pattern.

4. The semiconductor memory device of claim 3,
wherein a first portion of the source semiconductor layer is in contact with the lower semiconductor pattern,
wherein a second portion of the source semiconductor layer is below the second sidewall oxide pattern and is in contact with the middle semiconductor pattern, and
wherein an upper width of the second portion is greater than a lower width of the second portion.

5. The semiconductor memory device of claim 2,
wherein the upper semiconductor pattern comprises a channel region that is adjacent to a lowermost electrode of the electrodes that are stacked on the substrate, and
wherein the smallest value of the diameter of the middle semiconductor pattern is greater than a thickness of the channel region.

6. The semiconductor memory device of claim 2,
wherein the lower semiconductor pattern comprises a first void therein,
wherein the lower portion of the dummy structure comprises a second void therein, and
wherein the second void is larger than the first void.

7. The semiconductor memory device of claim 1, wherein a width of the first sidewall oxide pattern varies in inverse proportion to the diameter of the middle portion of the dummy structure.

8. The semiconductor memory device of claim 1, further comprising a bottom oxide pattern interposed between the substrate and the lower portion of the dummy structure.

9. The semiconductor memory device of claim 1,
wherein the dummy structure comprises a vertical semiconductor pattern that extends vertically from the substrate,
wherein a first portion of the vertical semiconductor pattern in the upper portion of the dummy structure has a first thickness,
wherein a second portion of the vertical semiconductor pattern in the lower portion of the dummy structure has a second thickness, and
wherein the first thickness is smaller than the second thickness.

10. A semiconductor device comprising:
a substrate;
an electrode structure including electrodes that are stacked on the substrate;
a dummy structure penetrating a staircase structure of the electrode structure;
a vertical channel structure penetrating the electrode structure to be electrically connected to the substrate, wherein the vertical channel structure comprises a vertical semiconductor pattern that extends vertically from the substrate;
a first sidewall oxide pattern interposed between the substrate and the vertical channel structure; and
a second sidewall oxide pattern interposed between the substrate and the dummy structure, wherein the second sidewall oxide pattern is larger than the first sidewall oxide pattern;
wherein the vertical semiconductor pattern includes a lower semiconductor pattern electrically connected to the substrate, an upper semiconductor pattern on the lower semiconductor pattern, and a middle semiconductor pattern between the lower semiconductor pattern and the upper semiconductor pattern,
wherein the middle semiconductor pattern is below a lowermost electrode of the electrodes that are stacked on the substrate,
wherein the vertical channel structure further comprises a gap-fill insulating pattern on an inner surface of the upper semiconductor pattern,
wherein a lowermost point of the gap-fill insulating pattern is located at a level lower than the lowermost electrode, and
wherein the gap-fill insulating pattern is spaced apart from the lower semiconductor pattern by the middle semiconductor pattern.

11. The semiconductor device of claim 10, wherein, with increasing vertical distance from the upper semiconductor pattern, a diameter of the middle semiconductor pattern decreases until it reaches its smallest value and then increases.

12. The semiconductor device of claim 10, further comprising a sidewall oxide pattern interposed between the substrate and the vertical channel structure,
wherein the substrate comprises a lower semiconductor layer, a source semiconductor layer, and an upper semiconductor layer that are sequentially stacked, and
wherein the sidewall oxide pattern is interposed between the upper semiconductor layer and the middle semiconductor pattern.

13. The semiconductor device of claim 12,
wherein a first portion of the source semiconductor layer is in contact with the lower semiconductor pattern,
wherein a second portion of the source semiconductor layer is in contact with the middle semiconductor pattern, and
wherein an upper width of the second portion is greater than a lower width of the second portion.

14. The semiconductor device of claim 10,
wherein the upper semiconductor pattern includes a channel region adjacent to the lowermost electrode, and
wherein a smallest diameter of the middle semiconductor pattern is greater than a thickness of the channel region.

15. The semiconductor device of claim 10, further comprising a bottom oxide pattern interposed between the substrate and the lower semiconductor pattern.

16. A semiconductor memory device comprising:
a first substrate;
a peripheral circuit structure including peripheral transistors on the first substrate;
a second substrate on the peripheral circuit structure, the second substrate including a cell array region and a connection region;
an electrode structure including electrodes that are stacked on the second substrate, the electrode structure having a staircase structure on the connection region;
a vertical channel structure penetrating the electrode structure on the cell array region to be electrically connected to the second substrate;
a dummy structure penetrating the staircase structure on the connection region;
an interlayer insulating layer on the electrode structure;
a bit line on the interlayer insulating layer and electrically connected to the vertical channel structure; and
an upper interconnection line electrically connected to the staircase structure,
wherein each of the vertical channel structure and the dummy structure comprises:
a vertical semiconductor pattern that extends vertically from the second substrate;
a vertical insulating pattern interposed between the vertical semiconductor pattern and the electrode structure, the vertical insulating pattern including a tunnel insulating layer, a charge storing layer, and a blocking insulating layer; and
a gap-fill insulating pattern on an inner surface of the vertical semiconductor pattern,
wherein the dummy structure includes an upper portion that is above the second substrate, a lower portion that extends into the second substrate, and a middle portion interposed between the upper portion and the lower portion, and
wherein a diameter of the middle portion decreases from a top surface of the second substrate toward a bottom surface of the second substrate, reaches a smallest value between the top surface and the bottom surface, and then increases toward the bottom surface.

17. The semiconductor memory device of claim 16, further comprising:
a first sidewall oxide pattern interposed between a first sidewall of the second substrate and a sidewall of the vertical channel structure; and
a second sidewall oxide pattern interposed between a second sidewall of the second substrate and a sidewall of the dummy structure.

18. The semiconductor memory device of claim 16,
wherein the vertical semiconductor pattern of the vertical channel structure includes a lower semiconductor pattern that extends into and is electrically connected to the second substrate, an upper semiconductor pattern that is above the second substrate, and a middle semiconductor pattern between the lower semiconductor pattern and the upper semiconductor pattern, and
wherein a diameter of the middle semiconductor pattern decreases from the top surface of the second substrate toward the bottom surface of the second substrate, reaches a smallest value between the top surface and the bottom surface, and then increases toward the bottom surface.

19. The semiconductor memory device of claim 18, wherein the gap-fill insulating pattern of the vertical channel structure is spaced apart from the lower semiconductor pattern by the middle semiconductor pattern.

* * * * *